(12) United States Patent
Matsumoto et al.

(10) Patent No.: US 10,957,712 B2
(45) Date of Patent: Mar. 23, 2021

(54) SUBSTRATE AND METHOD FOR PRODUCING SUBSTRATE

(71) Applicant: Sharp Kabushiki Kaisha, Sakai (JP)

(72) Inventors: Ryuji Matsumoto, Sakai (JP); Yoshimasa Chikama, Sakai (JP); Hirokazu Furukawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/635,577

(22) PCT Filed: Jul. 26, 2018

(86) PCT No.: PCT/JP2018/028001
§ 371 (c)(1),
(2) Date: Jan. 31, 2020

(87) PCT Pub. No.: WO2019/026741
PCT Pub. Date: Feb. 7, 2019

(65) Prior Publication Data
US 2020/0219903 A1  Jul. 9, 2020

(30) Foreign Application Priority Data
Aug. 2, 2017 (JP) .............................. JP2017-150268

(51) Int. Cl.
*H01L 23/52* (2006.01)
*H01L 27/12* (2006.01)
*H01L 21/311* (2006.01)

(52) U.S. Cl.
CPC .... *H01L 27/1218* (2013.01); *H01L 21/31116* (2013.01); *H01L 27/124* (2013.01); *H01L 27/1262* (2013.01)

(58) Field of Classification Search
CPC .......... H01L 21/31116; H01L 27/1218; H01L 27/1262; H01L 27/124
(Continued)

(56) References Cited

U.S. PATENT DOCUMENTS 8,455,868 B2 * 6/2013 Yamazaki ............... H01L 29/24
257/43
9,349,673 B2 * 5/2016 Yoda .................. H01L 21/76898
(Continued)

FOREIGN PATENT DOCUMENTS

JP      04-358128 A    12/1992
JP      11-204498 A     7/1999
(Continued)

OTHER PUBLICATIONS

Official Communication issued in International Patent Application No. PCT/JP2018/028001, dated Oct. 23, 2018.

*Primary Examiner* — Luan C Thai
(74) *Attorney, Agent, or Firm* — Keating & Bennett, LLP

(57) ABSTRACT

A substrate of the present invention sequentially includes an insulating substrate, a lower layer, a first insulating film, a second insulating film, and an upper layer. The substrate is provided with a hole reaching at least one of the lower layer or the insulating substrate through at least the first insulating film and the second insulating film. The first insulating film includes in a region with the hole a protrusion that protrudes from an end portion in contact with the first insulating film of the second insulating film. The substrate includes a stepwise structure including the protrusion and the end portion. The upper layer coats the stepwise structure. An upper surface portion of the first insulating film in a region with the protrusion and an upper surface portion of the first insulating film in a region below the end portion of the second insulating film are coplanar.

14 Claims, 11 Drawing Sheets

(58) Field of Classification Search
USPC .......................................................... 257/749
See application file for complete search history.

(56) References Cited

U.S. PATENT DOCUMENTS

| | | | |
|---|---|---|---|
| 9,406,628 B2* | 8/2016 | Matsumoto | H01L 24/48 |
| 9,496,232 B2* | 11/2016 | Yajima | H01L 24/03 |
| 2009/0152563 A1* | 6/2009 | Hayashi | H01L 27/14609 |
| | | | 257/72 |
| 2011/0156027 A1 | 6/2011 | Yamazaki et al. | |
| 2011/0297930 A1 | 12/2011 | Choi et al. | |
| 2013/0256657 A1 | 10/2013 | Yamazaki et al. | |
| 2014/0008816 A1 | 1/2014 | Yoda | |
| 2014/0302683 A1 | 10/2014 | Kikuchi et al. | |
| 2016/0260718 A1 | 9/2016 | Yamazaki et al. | |
| 2018/0286864 A1 | 10/2018 | Yamazaki et al. | |

FOREIGN PATENT DOCUMENTS

| | | | |
|---|---|---|---|
| JP | 2011-151383 A | 8/2011 | |
| JP | 2011-258949 A | 12/2011 | |
| JP | 2013-030531 A | 2/2013 | |
| JP | 2014-013810 A | 1/2014 | |
| JP | 2015-079936 A | 4/2015 | |

* cited by examiner (a)

(b)

(c)

(d)

(e)

(a)

(b)

(c)

(a)

(b)

(c)

(a)

(b)

(a)

(b)

(c)

(a)

(b)

(c)

SUBSTRATE AND METHOD FOR PRODUCING SUBSTRATE

TECHNICAL FIELD

The present invention relates to substrates and methods for producing a substrate. The present invention specifically relates to a substrate including multiple insulating films and a method for producing the substrate.

BACKGROUND ART

Electronic devices are required to have various functions, whereby substrates for such electronic devices have complicated structures. For example, in a liquid crystal display panel with high definition, an active matrix substrate including thin-film transistors (TFTs) has an increased number of layers and a complicated structure, whereby insulating layers are disposed in many layers.

As a technique for producing a substrate by etching multiple layers, for example, Patent Literature 1 discloses a substrate including: a base board; a first insulating layer; a second insulating layer; a third insulating layer; a pad electrode; and a hole formed to penetrate the base board, the first insulating layer, the second insulating layer, and the third insulating layer and reaching the pad electrode from the base board, wherein a diameter of the hole in the first insulating layer is larger than a diameter of the hole in the second insulating layer, and the first insulating layer and the second insulating layer are formed using different materials from each other and the second insulating layer and the third insulating layer are formed using different materials from each other.

Patent Literature 2 discloses a TFT display panel including: a gate electrode formed on an insulation substrate; a gate insulting layer; an oxide semiconductor layer; a drain electrode; and a passivation layer, wherein the passivation layer includes a first passivation layer and a second passivation layer, the passivation layer has a first contact hole, and the first contact hole has a shape in which the cross-sectional area increases from the bottom surface to the top.

Patent Literature 3 discloses a method for producing a low-temperature polysilicon thin-film transistor, including: forming a polysilicon layer on a substrate; sequentially forming on the polysilicon layer a gate insulating layer having a laminate structure including silicon oxide and silicon nitride and a gate layer; forming a photoresist on the gate layer; removing the silicon nitride and the gate layer in region(s) not covered with the photoresist by treating the substrate by plasma etching and reactive ion etching; forming a gate foot and a gate; and forming a source/drain and a lightly doped drain.

CITATION LIST

Patent Literature

Patent Literature 1: JP 2014-13810 A
Patent Literature 2: JP 2011-258949 A
Patent Literature 3: JP 2015-79936 A

SUMMARY OF INVENTION

Technical Problem

FIG. 14 is a schematic cross-sectional view of an active matrix substrate of Comparative Embodiment 1. As shown in FIG. 14, an active matrix substrate 1R of Comparative Embodiment 1 has a laminate structure sequentially including an insulating substrate 100R that is a glass substrate, a lower layer 200R containing metal, a first insulating film 310R containing $SiO_2$, a second insulating film 320R containing $SiN_x$, and an upper layer 400R containing metal. The active matrix substrate 1R of Comparative Embodiment 1 is provided with a hole 500R that reaches the lower layer 200R through the first insulating film 310R and the second insulating film 320R. The upper layer 400R is in contact with the lower layer 200R in a region with the hole 500R. The hole 500R is thus used as a contact hole.

As shown in FIG. 14, the tapered portion of the first insulating film 310R and the second insulating film 320R in the active matrix substrate 1R of Comparative Embodiment 1 is thick and steep. In addition, the tapered portion may have on the surface thereof an etched residue generated during etching of the first insulating film 310R and the second insulating film 320R.

This prevents the upper layer 400R from coating the inner side of the hole 500R sufficiently, which may reduce the adhesiveness of the upper layer 400R coating the hole 500R.

The active matrix substrate 1R of Comparative Embodiment 1 may have the following disadvantages: the reduction in adhesiveness of the upper layer 400R may increase the contact resistance; and chemicals used in the following process may penetrate through the tapered portion to etch the lower layer 200R, thereby causing defects such as corrosion, poor contact, and film peeling. In addition, a liquid crystal display panel produced using the active matrix substrate 1R of Comparative Embodiment 1 may absorb moisture in the air to be corroded if the upper layer 400R fails to completely coat the hole 500R, such as in the case where the tapered portion of the active matrix substrate 1R of Comparative Embodiment 1 forms the right angle or an angle close to the right angle with the insulating substrate 100R, in the case where the tapered portion has a reverse tapered shape, and in the case where the tapered portion has on the surface thereof a large amount of the etched residue.

In the embodiment shown in FIG. 14, the insulating substrate 100R is not in contact with the upper layer 400R. When the lower layer 200R is partly present in the inner side of the hole 500R, the insulating substrate 100R is also exposed in the hole 500R. In this case, the insulating substrate 100R is in contact with the upper layer 400R. If the tapered portion of the first insulating film 310R and the second insulating film 320R is thick and steep in this case, the above disadvantages may also be caused.

In the embodiment shown in FIG. 14, the hole 500R is used as a contact hole. For example, the hole 500R may also be used as a ditch into which an alignment film material for forming an alignment film on the active matrix substrate 1R is flowed in order to control the region for applying the alignment film material. In this case, no lower layer 200R is disposed in this region and the hole 500R reaches the insulating substrate 100R through the first insulating film 310R and the second insulating film 320R. Thus, the upper layer 400R including the alignment film is in contact with the insulating substrate 100R in the region with the hole 500R. Similarly to the above case, if the tapered portion of the first insulating film 310R and the second insulating film 320R is thick and steep, the upper layer 400R may have poor coating quality and adhesiveness, which may cause defects such as penetration of chemicals, absorption of moisture in the air, corrosion, poor contact, and film peeling.

FIG. 15 is a schematic cross-sectional view of an active matrix substrate of Comparative Embodiment 2. As shown in FIG. 15, an active matrix substrate 1R of Comparative Embodiment 2 has a laminate structure sequentially including the insulating substrate 100R that is a glass substrate, the lower layer 200R containing metal, the first insulating film 310R containing $SiN_x$, the second insulating film 320R containing $SiO_2$, a third insulating film 330R containing $SiN_x$, and an upper layer 400R containing metal. The active matrix substrate 1R of Comparative Embodiment 2 is provided with the hole 500R that reaches the lower layer 200R through the first insulating film 310R, the second insulating film 320R, and the third insulating film 330R. The upper layer 400R is in contact with the lower layer 200R in the region with the hole 500R.

As shown in FIG. 15, in the active matrix substrate 1R of Comparative Embodiment 2, the second insulating film 320R has a widely tapered portion. Thus, the upper layer 400R tends to be formed in the inner side of the hole 500R compared with the case of a steeply tapered portion, which can prevent the upper layer 400R from having poor coating quality. This resultantly prevents the upper layer 400R from having poor adhesiveness. Unfortunately, the structure in Comparative Embodiment 2 requires a region for forming a widely tapered portion, which limits the reduction of the size of the hole 500R.

Similarly to Comparative Embodiment 2, the hole in the substrate of Patent Literature 1 and the first contact hole in the thin-film transistor display panel of Patent Literature 2 both have a widely tapered portion, which limits the reduction of the size of the hole or the first contact hole. Patent Literature 3 discloses a technique for etching a gate layer but fails to disclose a technique for forming a hole.

The present invention has been made under the current situation in the art and aims to provide a substrate provided with a small hole penetrating multiple insulating films and with an upper layer that is disposed on the multiple insulating films and has excellent coating quality and adhesiveness in the hole region, and a method for producing the substrate which enables formation of the hole in the multiple insulating films at once by dry etching.

Solution to Problem

The present inventors made various studies on a substrate provided with a small hole penetrating multiple insulating films and with an upper layer that is disposed on the multiple insulating films and has excellent coating quality (step coating quality) and adhesiveness in the hole region, and a method for producing the substrate which enables formation of the hole in the multiple insulating films at once by dry etching. Then, in a substrate having a laminate structure sequentially including an insulating substrate, a lower layer, a first insulating film, and a second insulating film, they focused on forming a hole that reaches at least one of the lower layer or the insulating substrate through at least the first insulating film and the second insulating film. In the hole region, the first insulating film protrudes from an end portion in contact with the first insulating film of the second insulating film, whereby a stepwise structure is formed which includes the protrusion of the first insulating film and the end portion of the second insulating film. Then, an upper layer is formed so as to coat the stepwise structure. The inventors thereby found that, in this case, the upper layer coats not one large step consisting of multiple insulating films but two relatively small steps consisting of the first insulating film and the second insulating film, which improves the coating quality and adhesiveness of the upper layer. The structure with the upper layer coating such a stepwise structure enables the first and second insulating films to each have a comparatively steep side surface on the side closer to the hole while keeping the coating quality and adhesiveness of the upper layer.

The inventors also found the following. The structure in which the upper surface portion of the first insulating film in the region with the protrusion and the upper surface portion of the first insulating film in a region below the end portion of the second insulating film are coplanar eliminates the need for forming a widely tapered shape on the upper surface portion of the protrusion of the first insulating film. Thereby, the end portion of the second insulating film on the first insulating film can appropriately come close to the side surface closer to the hole of the first insulating film. As a result, the insulating films can each have a comparatively steep side surface on the side closer to the hole and the hole size can also be reduced.

The inventors further found the following. In the etching step where a hole that reaches at least one of the lower layer or the insulating substrate is formed through the first insulating film and the second insulating film, first etching and second etching are performed. In the first etching, using a first etching gas, the second insulating film is etched in the region vertically below an aperture in a mask and in the region vertically below the aperture side end portion of the mask to expose the first insulating film. In the second etching, using a second etching gas, the first insulating film is etched in the region vertically below the aperture to expose at least one of the lower layer or the insulating substrate while keeping the upper surface portion of the first insulating film in the exposed region vertically below the end portion of the mask unetched. Thereby, the stepwise structure can be formed with one mask. The inventors thus successfully solved the issues to arrive at the present invention.

In other words, an aspect of the present invention may be a substrate including: an insulating substrate; a lower layer stacked above the insulating substrate; a first insulating film stacked on the lower layer; a second insulating film stacked on the first insulating film; and an upper layer stacked on the second insulating film, the substrate being provided with a hole reaching at least one of the lower layer or the insulating substrate through at least the first insulating film and the second insulating film, the first insulating film including in a region with the hole a protrusion that protrudes from an end portion in contact with the first insulating film of the second insulating film, the substrate including a stepwise structure including the protrusion of the first insulating film and the end portion of the second insulating film, the upper layer coating the stepwise structure, an upper surface portion of the first insulating film in a region with the protrusion and an upper surface portion of the first insulating film in a region below the end portion of the second insulating film being coplanar.

The substrate may further include on a side surface closer to the hole of the second insulating film a modified layer containing a material different from a material of the second insulating film.

The substrate may further include on the upper surface portion of the protrusion a wall located apart from the second insulating film.

The wall may include a modified layer containing a material different from a material of the second insulating film on a side remote from the second insulating film.

The second insulating film may be a silicon nitride film, and the first insulating film may be a silicon oxide film, a silicon nitride film having a lower etching rate than the second insulating film, or a silicon oxynitride film.

The second insulating film may be a silicon oxynitride film, and the first insulating film may be a silicon oxide film or a silicon oxynitride film having a lower etching rate than the second insulating film.

The end portion is a first end portion, and the substrate may further include an organic insulating film between the first insulating film and the second insulating film, the hole may reach at least one of the lower layer or the insulating substrate through the first insulating film, the second insulating film, and the organic insulating film, and the organic insulating film may include in the region with the hole a protrusion that protrudes from a second end portion of the second insulating film.

The substrate may further include a transparent conductive film between the first insulating film and the second insulating film, and the transparent conductive film may include in the region with the hole a protrusion that protrudes from a second end portion of the second insulating film.

Another aspect of the present invention may be a method for producing a substrate, including: an etching step including dry-etching a pre-treated substrate including an insulating substrate, a lower layer stacked above the insulating substrate, a first insulating film stacked on the lower layer, and a second insulating film stacked on the first insulating film through a mask provided with an aperture to form a hole reaching at least one of the lower layer or the insulating substrate through at least the first insulating film and the second insulating film, the etching step including: first etching including etching the second insulating film in a region vertically below the aperture and in a region vertically below an aperture side end portion of the mask using a first etching gas to expose the first insulating film; and second etching including etching the first insulating film in a region vertically below the aperture using a second etching gas to expose at least one of the lower layer or the insulating substrate while keeping an upper surface portion of the first insulating film unetched in an exposed region vertically below the end portion of the mask.

In the first etching, the first insulating film in the exposed region vertically below the aperture may be partly etched.

In the second etching, a modified layer containing a material different from a material of the second insulating film may be formed on a side surface closer to the hole of the second insulating film.

The second insulating film may be kept coated with the mask until the second etching is finished.

In the second etching, the second insulating film may be etched while the mask is etched to expand the aperture until the modified layer and part of the second insulating film are exposed from the mask.

The first etching gas may contain $SF_6$ and $O_2$, and the second etching gas may contain $CF_4$ and $O_2$ or Ar.

The first etching gas may contain 20 mol % or more of $O_2$ relative to a whole amount of the first etching gas.

The second etching gas may contain 10 mol % or more and 60 mol % or less of $O_2$ or Ar relative to a whole amount of the second etching gas.

The pre-treated substrate may further include an organic insulating film between the first insulating film and the second insulating film, and in the first etching, the first insulating film and the organic insulating film may be exposed in the region vertically below the aperture, the organic insulating film may be exposed in the region vertically below a second end portion closer to the aperture of the mask, and etching of the second insulating film may continue even after exposure of the organic insulating film.

The pre-treated substrate may further include a transparent conductive film between the first insulating film and the second insulating film, and in the first etching, the first insulating film and the transparent conductive film may be exposed in the region vertically below the aperture, the transparent conductive film may be exposed in the region vertically below the second end portion closer to the aperture of the mask, and etching of the second insulating film may continue even after exposure of the transparent conductive film.

Advantageous Effects of Invention

The present invention can provide a substrate provided with a small hole penetrating multiple insulating films and with an upper layer that is disposed on the multiple insulating films and has excellent coating quality and adhesiveness in the hole region, and a method for producing the substrate which enables formation of the hole in the multiple insulating films at once by dry etching.

BRIEF DESCRIPTION OF DRAWINGS

FIG. 1(a) is a schematic cross-sectional view; FIG. 1(b) is an enlarged schematic cross-sectional view showing a part in FIG. 1(a); FIG. 1(c) shows Alternative Example 1 of the part shown in the enlarged schematic cross-sectional view; FIG. 1(d) shows Alternative Example 2 of the part shown in the enlarged schematic cross-sectional view; and FIG. 1(e) shows Alternative Example 3 of the part shown in the enlarged schematic cross-sectional view.

FIG. 4(a) is a schematic plan view of a region including a hole; FIG. 4(b) is a schematic cross-sectional view taken along the line a-b in FIG. 4(a); and FIG. 4(c) is a schematic cross-sectional view taken along the line c-d in FIG. 4(a).

FIG. 5(a) is a schematic plan view of a region including a hole; FIG. 5(b) is a schematic cross-sectional view taken along the line a-b in FIG. 5(a); and FIG. 5(c) is a schematic cross-sectional view taken along the line c-d in FIG. 5(a).

FIG. 8(a) is a schematic cross-sectional view showing a crystalline silicon TFT and an oxide semiconductor TFT of the active matrix substrate; and FIG. 8(b) is an enlarged schematic cross-sectional view of a contact hole part.

FIG. 9(a) is a schematic cross-sectional view of a workpiece during etching of a second insulating film; FIG. 9(b) is a schematic cross-sectional view of the workpiece with a first insulating film exposed; FIG. 9(c) is a schematic cross-sectional view of the first insulating film during etching; and FIG. 9(d) is a schematic cross-sectional view of a state after upper layer formation.

FIG. 12(a) is a schematic plan view of a region including a hole; FIG. 12(b) is a schematic cross-sectional view taken along the line a-b in FIG. 12(a); and FIG. 12(c) is a schematic cross-sectional view taken along the line c-d in FIG. 12(a).

FIG. 13(a) is a schematic plan view of a region including a hole; FIG. 13(b) is a schematic cross-sectional view taken along the line a-b in FIG. 13(a); and FIG. 13(c) is a schematic cross-sectional view taken along the line c-d in FIG. 13(a).

DESCRIPTION OF EMBODIMENTS

The present invention is described below in more detail based on embodiments with reference to the drawings. The embodiments, however, are not intended to limit the scope of the present invention. The configurations employed in the embodiments may appropriately be combined or modified within the spirit of the present invention.

Embodiment 1

The present embodiment is described with reference to an active matrix substrate used in a fringe field switching (FFS) mode liquid crystal display panel. The liquid crystal display panel includes a pair of substrates, which are an active matrix substrate including switching elements and a color filter (CF) substrate facing the active matrix substrate, and a liquid crystal layer between the pair of substrates. The active matrix substrate includes pixel electrodes and a common electrode provided with apertures (slits). Changing the voltage applied between these electrodes can control the alignment of liquid crystal molecules in the liquid crystal layer. In the present embodiment, a common electrode provided with apertures is disposed above planar pixel electrodes. Alternatively, the positions of the pixel electrodes and the common electrode may be switched and pixel electrodes provided with apertures may be disposed above a planar common electrode.

The active matrix substrate includes scanning lines, data lines, and TFTs connected to the scanning lines and the data lines. Each TFT is a three-terminal switch including a thin-film semiconductor, a gate electrode formed from part of a scanning line, a source electrode formed from part of a data line, and a drain electrode connected to the corresponding pixel electrode.

The thin-film semiconductor of the present embodiment may be an oxide semiconductor containing at least one of indium, gallium, zinc, copper (Cu), silicon (Si), tin (Sn), aluminum (Al), calcium (Ca), germanium (Ge), or lead (Pb), for example, although the material of the thin-film semiconductor is not limited thereto. The thin-film semiconductor of the present embodiment is preferably an In—Ga—Zn—O-based semiconductor mainly containing indium (In), gallium (Ga), zinc (Zn), and oxygen (O).

Figure 1:
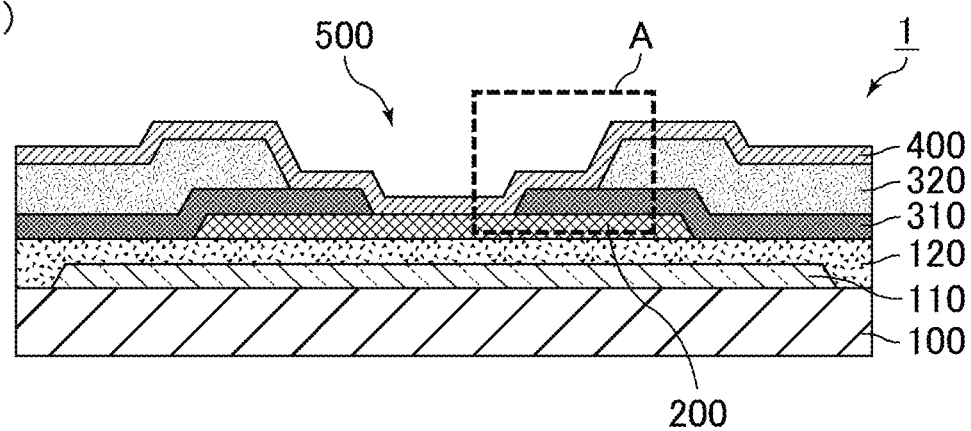
FIG. 1 includes drawings relating to an active matrix substrate of Embodiment 1.
Figure 1:
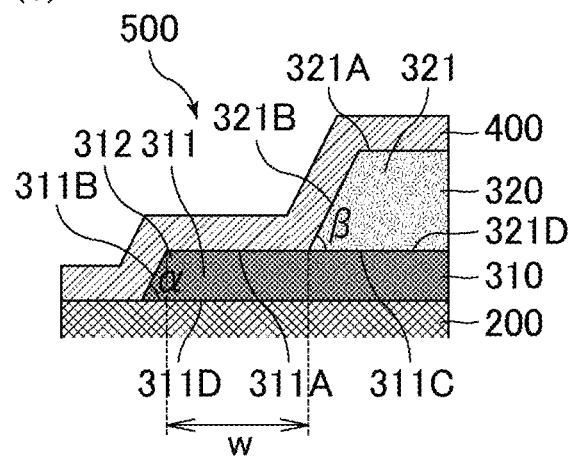
Figure 1:
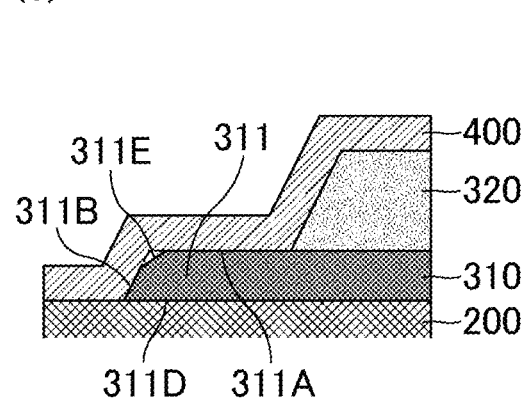
Figure 1:
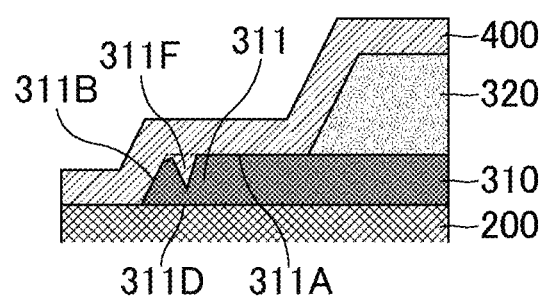
Figure 1:
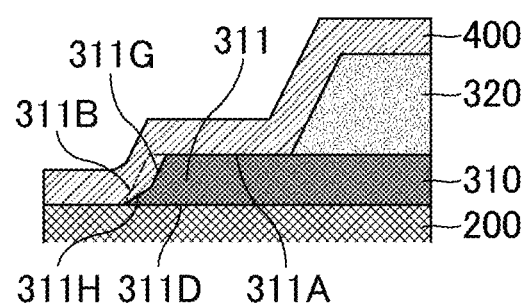

FIG. 1 includes drawings relating to an active matrix substrate of Embodiment 1: FIG. 1(a) is a schematic cross-sectional view; FIG. 1(b) is an enlarged schematic cross-sectional view showing a part in FIG. 1(a); FIG. 1(c) shows Alternative Example 1 of the part shown in the enlarged schematic cross-sectional view; FIG. 1(d) shows Alternative Example 2 of the part shown in the enlarged schematic cross-sectional view; and FIG. 1(e) shows Alternative Example 3 of the part shown in the enlarged schematic cross-sectional view. FIG. 1(b) is a schematic cross-sectional view of a stepwise structure A surrounded by the broken line in FIG. 1(a).

As shown in FIG. 1, an active matrix substrate 1 of the present embodiment includes an insulating substrate 100, a gate layer electrode 110 stacked on the insulating substrate 100, a gate insulating film 120 stacked on the gate layer electrode 110, a lower layer 200 that includes a source layer electrode and stacked on the gate insulating film 120, a first insulating film 310 that is a silicon oxide film and stacked on the lower layer 200, a second insulating film 320 that is a silicon nitride film and stacked on the first insulating film 310, and an upper layer 400 that includes pixel electrodes and stacked on the second insulating film 320. The gate layer electrode herein means an electrode that contains the same material as that of the scanning lines and of the gate electrodes and is disposed in the same layer as for these members. The source layer electrode herein means an electrode that contains the same material as that of the data lines and of the source electrodes and is disposed in the same layer as for these members.

The active matrix substrate 1 of the present embodiment is provided with a hole 500 that reaches the lower layer 200 through the first insulating film 310 and the second insulating film 320. In the region with the hole 500, the first insulating film 310 includes a protrusion 311 that protrudes from an end portion 321 in contact with the first insulating film 310 of the second insulating film 320, whereby the substrate 1 includes a stepwise structure A including the protrusion 311 of the first insulating film 310 and the end portion 321 of the second insulating film 320. Specifically, in the region with the hole 500, an end portion 312 of the first insulating film 310 protrudes from the end portion 321 of the second insulating film 320. That is, the end portion 321 of the second insulating film 320 is set back from the end portion 312 of the first insulating film 310, whereby the two steps corresponding to the first insulating film 310 and the second insulating film 320 form a stepwise pattern. In the region with the hole 500, the first insulating film 310 and the second insulating film 320 form a stepwise pattern in such a manner that the bottom of the hole 500 is smaller than the top thereof, and at least the protrusion 311 of the first insulating film 310 is in contact with the lower layer 200. The "bottom" herein means the insulating substrate side and the "top" herein means the side remote from the insulating substrate.

The upper layer 400 coats the stepwise structure A and is in contact with an upper surface portion 321A and a side surface 321B of the end portion 321 of the second insulating film 320, an upper surface portion 311A and a side surface 311B of the protrusion 311 of the first insulating film 310, and the lower layer 200. As described, in the region with the hole 500, the first insulating film 310 protrudes from the end portion 321 in contact with the first insulating film 310 of the second insulating film 320, whereby the stepwise structure A is formed which includes the protrusion 311 of the first insulating film 310 and the end portion 321 of the second insulating film 320. Then, the upper layer 400 is formed so as to coat the stepwise structure A. Thereby, the upper layer 400 coats not one large step consisting of multiple insulating films but two relatively small steps consisting of the first insulating film 310 and the second insulating film 320, which improves the coating quality and adhesiveness of the upper layer 400. The structure with the upper layer 400 coating such a stepwise structure A enables the first insulating film 310 and the second insulating film 320 to respectively have a comparatively steep side surfaces 311 B and 321B on the side closer to the hole 500 while keeping the coating quality and adhesiveness of the upper layer 400. Since the upper layer 400 is excellent in adhesiveness, corrosion and film peeling can be prevented which are caused by penetration of chemicals or the like due to reduced adhesiveness of the upper layer 400.

Furthermore, the upper surface portion of the first insulating film 310 is located on one plane in the outside (the hole 500 side) region and in the inside (the side remote from the hole 500) region of the end portion 321 of the second insulating film 320. Specifically, the upper surface portion 311A of the first insulating film 310 in the region with the protrusion 311 and the upper surface portion 311C of the first insulating film 310 in the region below the end portion 321 of the second insulating film 320 are coplanar. This embodiment eliminates the need for forming a widely tapered shape on the upper surface portion of the first insulating film 310 in the region with the protrusion 311. Thereby, the end portion 321 of the second insulating film 320 on the first insulating film 310 can appropriately come close to the side surface 311B closer to the hole 500 of the first insulating film 310. As a result, the insulating films can each have a comparatively steep side surface 311B or 321B on the side closer to the hole 500 and the size of the hole 500 can also be reduced. Accordingly, the active matrix substrate 1 of the present embodiment can achieve high definition. The phrase "the upper surface portion of the first insulating film in the region with the protrusion and the upper surface portion of the first insulating film in the region below the end portion of the second insulating film are coplanar" herein includes the case where the upper surface portions in these two regions are substantially coplanar and the case where the hole side corner of the protrusion (upper part of the hole side end portion of the protrusion) is deformed. Examples of the latter case include the case as shown in FIG. 1(c), where the hole side corner of the protrusion 311 is obliquely chipped, whereby the upper surface portion 311A and the side surface 311B of the protrusion 311 are connected via a slope 311E (the case where the protrusion 311 consists of four surfaces including a bottom surface 311D, the side surface 311B, the slope 311E, and the upper surface portion 311A and the inner portion); the case as shown in FIG. 1(d), where the hole side corner of the protrusion 311 is scooped, whereby a recess 311F (or a ditch) appears between the upper surface portion 311A and the side surface 311B of the protrusion 311; and the case as shown in FIG. 1(e), where the hole side corner and the side surface of the protrusion 311 are scooped, whereby the upper slope 311G and a lower slope 311H having a smaller inclination than the slope 311G are formed, and the upper surface portion 311A and the bottom surface 311D of the protrusion 311 are connected via the slopes 311G and 311H (the case where the protrusion 311 consists of four surfaces including the bottom 311D, the slopes 311G and 311H, and the upper surface portion 311A and the inner portion). Of course, the hole side corner of the protrusion 311 may have no deformation and the upper surface portion 311A and the side surface 311B of the protrusion 311 may be directly connected as shown in FIG. 1(b) (the protrusion 311 may consists of three surfaces including the bottom surface 311D, the side surface 311B, and the upper surface portion 311A and the inner portion).

In FIG. 1, the insulating substrate 100 is not in contact with the upper layer 400. The region with the hole 500 may not include the gate layer electrode 110 and the gate insulating film 120, and the lower layer 200 may be partly disposed in the hole 500. In this case, the insulating substrate 100 is exposed in the hole 500 and thus is in contact with the upper layer 400.

Hereinafter, the active matrix substrate 1 of the present embodiment is specifically described. The insulating substrate 100 included in the active matrix substrate 1 of the present embodiment may contain any material as long as it is a transparent material such as glass or plastic.

The scanning lines and the data lines of the active matrix substrate 1 of the present embodiment are disposed with intersections. In the vicinity of the intersections of the scanning lines and the data lines are disposed TFTs as switching elements.

The scanning lines and the data lines may be formed by forming a single-layer or multilayer film of a metal such as titanium, aluminum, molybdenum, copper, or chromium or an alloy of these by a method such as sputtering and then patterning the film by a method such as photolithography. The gate layer electrode 110 of the present embodiment is disposed in the same layer as for the scanning lines and contains the same material as that of the scanning lines. The gate layer electrode 110 is a layer containing a metal such as titanium, aluminum, molybdenum, copper, or chromium or an alloy of these, i.e., a conductive layer.

The gate electrodes, source electrodes, and drain electrodes constituting the TFTs may be formed by forming a single-layer or multilayer film of a metal such as titanium, aluminum, molybdenum, copper, or chromium or an alloy of these by a method such as sputtering and patterning the film by a method such as photolithography.

Among the lines and electrodes such as scanning lines, data lines, and electrodes constituting the TFTs, including gate electrodes, source electrodes, and drain electrodes, those to be formed in the same layer may be formed from the same material in the same step, which enables efficient production of the substrate.

The gate insulating film 120 is disposed between the gate layer electrode 110 and the lower layer 200 including a source layer electrode. Examples of the gate insulating film 120 include inorganic films (relative permittivity $\varepsilon$=5 to 7) such as a silicon nitride film mainly contain silicon nitride, a silicon oxide film mainly contain silicon oxide, and a multilayer film of these.

The lower layer 200 includes a source layer electrode. The lower layer 200 is disposed in the same layer as for the data lines and is formed from the same material as that of the data lines. The lower layer 200 including a source layer electrode is a layer containing a metal such as titanium, aluminum, molybdenum, copper, or chromium or an alloy of these, i.e., a conductive layer.

The first insulating film 310 is preferably a silicon oxide film mainly containing silicon oxide ($SiO_x$, wherein x represents a positive value). The present embodiment describes the case where the first insulating film 310 is a silicon oxide film, although the first insulating film 310 is not limited thereto. As described below, when the second insulating film 320 is a silicon nitride film mainly containing silicon nitride ($SiN_x$, wherein x represents a positive value), examples of the first insulating film 310 include a silicon oxide film, a silicon nitride film having a lower etching rate than the second insulating film 320 (having a better film quality than the second insulating film 320), and a silicon oxynitride film mainly containing a silicon oxynitride ($SiO_xN_y$, wherein x and y each represent a positive value). In this embodiment, the stepwise structure A can be readily formed by the later-described method for producing the active matrix substrate 1. When the second insulating film 320 is a silicon oxynitride film, examples of the first insulating film 310 include a silicon oxide film and a silicon oxynitride film having a lower etching rate than the second insulating film 320 (having a better film quality than the second insulating film 320). In this embodiment, the stepwise structure A can be readily formed by the later-described method for producing the active matrix substrate 1. The film qualities of the first insulating film and the second insulating film can be controlled by conditions during film formation. For example, when the second insulating film 320 is a silicon nitride film, a silicon nitride film having a lower etching rate than the second insulating film 320 (having a better film quality than the second insulating film 320) can be formed by forming a silicon nitride film at a higher temperature or a lower power than those for forming the second insulating film 320. The film quality of the insulating film can be determined by evaluating the amount or number of impurities and defects by a method such as X-ray diffraction analysis. The difference in etching rate between the insulating films can be determined by dry etching using fluorine-based gas such as $SF_6$ or $CF_4$.

The first insulating film 310 includes the protrusion 311 that protrudes from the end portion 321 in contact with the first insulating film 310 of the second insulating film 320 in the region with the hole 500. The size of the protrusion 311 is not limited and may be appropriately adjusted. The inclination angle (tapered angle) of the side surface of the protrusion 311, i.e., an angle α formed by the bottom surface 311D and the side surface 311B of the protrusion 311 is preferably large in terms of reducing the size of the hole 500, while is preferably small in terms of improving the coating quality and adhesiveness of the upper layer 400, and may be appropriately set in the range of, for example, 20° or greater and 90° or smaller. The tapered angle (angle α) can be appropriately adjusted by, for example, changing the $O_2$ partial pressure of the etching gas that is used for etching the first insulating film 310 in the later-described production method. The protrusion width w of the upper surface portion 311A of the protrusion 311 is preferably small in terms of reducing the size of the hole 500, while is preferably large in terms of improving the coating quality and adhesiveness of the upper layer 400, and may be appropriately set in the range of, for example, 0.001 μm or greater and 2.0 μm or smaller. The protrusion width w can be appropriately adjusted by, for example, changing the shift amount of the second insulating film 320 in the later-described production method. The protrusion width w can also be adjusted by changing the thickness of the second insulating film 320 because the thickness of the second insulating film 320 depends on the duration of over etching in the first etching of the later-described production method.

The first insulating film 310 may have any thickness and the thickness can be appropriately adjusted according to the application. For example, when the hole 500 is used as a contact hole of a TFT in a pixel, the thickness of the first insulating film 310 is preferably 0.05 μm or greater and 1.0 μm or smaller.

The second insulating film 320 is preferably a silicon nitride film mainly containing silicon nitride ($SiN_x$, wherein x represents a positive value). The present embodiment describes the case where the second insulating film 320 is a silicon nitride film, although the second insulating film 320 is not limited thereto and may be any insulating film having a greater etching rate than the first insulating film 310. Examples of the second insulating film 320 include, in addition to a silicon nitride film, a silicon oxynitride film mainly containing silicon oxynitride ($SiO_xN_y$: wherein x and y each represent a positive value).

The end portion 321 of the second insulating film 320 is in contact with the upper surface portion 311C of the first insulating film 310. The inclination angle (tapered angle) of the side surface 321B of the end portion 321, i.e., an angle β formed by the bottom surface 321D of the second insulating film 320 and the side surface 321B of the end portion 321 is preferably large in terms of reducing the size of the hole 500, while is preferably small in terms of improving the coating quality and adhesiveness of the upper layer 400, and may be appropriately set in the range of, for example, 20° or greater and 90° or smaller. The tapered angle (angle β) can be appropriately adjusted by controlling the etching rate of the second insulating film 320.

The second insulating film 320 may have any thickness and the thickness can be appropriately adjusted according to the application. For example, when the hole 500 is used as a contact hole of a TFT in a pixel, the thickness of the second insulating film 320 is preferably 0.1 μm or greater and 0.7 μm or smaller.

The upper layer 400 is a layer including pixel electrodes. The upper layer 400 coats the stepwise structure A including the protrusion 311 of the first insulating film 310 and the end portion 321 of the second insulating film 320 and is in contact with the upper surface portion 321A and the side surface 321B of the end portion 321, the upper surface portion 311A and the side surface 311B of the protrusion 311, and the lower layer 200. In this embodiment, the upper layer 400 is connected to the lower layer 200.

The upper layer 400 (pixel electrodes) may be formed by forming a single-layer or multilayer film of a transparent conductive film material such as indium tin oxide (ITO), indium zinc oxide (IZO), zinc oxide (ZnO), or tin oxide (SnO) or an alloy of these by a method such as sputtering and then patterning the film by a method such as photolithography.

The upper layer 400 may have any thickness as long as the upper layer 400 can coat the stepwise structure A and can be in contact with the lower layer 200. The thickness thereof is preferably 0.02 μm or greater and 0.5 μm or smaller.

Embodiment 2

The features unique to the present embodiment are mainly described in the present embodiment, and the same features as those in the above embodiment will not be elaborated upon here. The active matrix substrate of the present embodiment has the same structure as in the active matrix substrate 1 of Embodiment 1, except that the second insulating film includes a modified layer.

Figure 2:
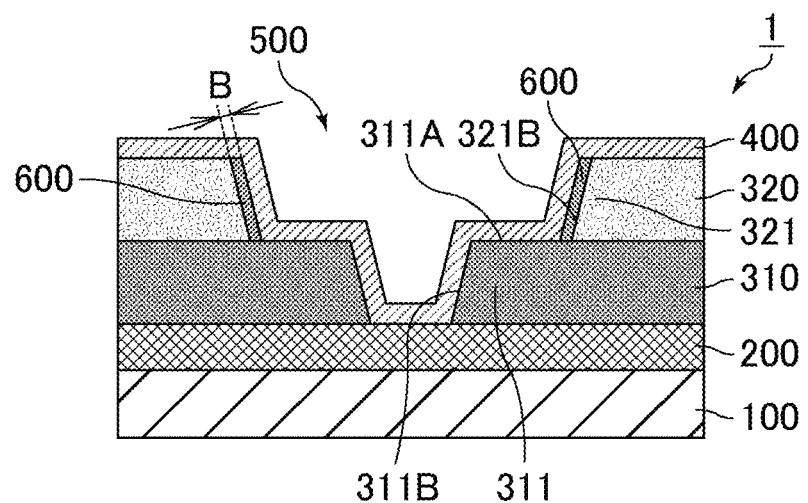
FIG. 2 is a schematic cross-sectional view of an active matrix substrate of Embodiment 2.

FIG. 2 is a schematic cross-sectional view of an active matrix substrate of Embodiment 2. The active matrix substrate 1 of the present embodiment includes a modified layer 600 containing a material different from the material of the second insulating film, on the side surface closer to the hole 500 of the second insulating film 320. In the present embodiment, as shown in FIG. 2, the modified layer 600 is disposed at least on the side surface 321B of the end portion 321 of the second insulating film 320. The modified layer 600 may be disposed also on the upper surface portion 311A and the side surface 311B of the protrusion 311 of the first insulating film 310.

The active matrix substrate 1 of the present embodiment includes the modified layer 600. Thus, in the later-described production process of the active matrix substrate 1, especially in the dry etching of the first insulating film 310 and the second insulating film 320, the etching amount (herein, also referred to as shift amount) can be controlled, which is the amount of the second insulating film 320 etched in the setback direction from the region vertically below the aperture of the mask. Thus, positional variation of the ends 321 of the second insulating film 320, i.e., size variation of the holes 500 can be reduced.

Examples of the material of the modified layer 600, i.e., the material different from the material of the second insulating film 320, include a modified material of the material disposed in the hole 500 and a modified material of the material of the later-described mask. Specific examples thereof include a modified material of the material of the first insulating film 310; a modified material of the material of the second insulating film 320; a modified material of the organic material contained in the later-described photoresist; a modified material of indium tin oxide; a modified material of indium zinc oxide; a modified material of zinc oxide; a modified material of tin oxide; and a modified material of copper, aluminum, titanium, or molybdenum or an alloy of these. The modified layer 600 may contain at least one of these materials.

The modified layer 600 has a thickness (the distance between the hole 500 side surface and the surface on the side remote from the hole 500) B of preferably 0.002 µm or greater and 0.5 µm or smaller. The modified layer 600, having such a small thickness, hardly gives an influence on the coating quality and adhesiveness of the upper layer 400.

Embodiment 3

Figure 3:
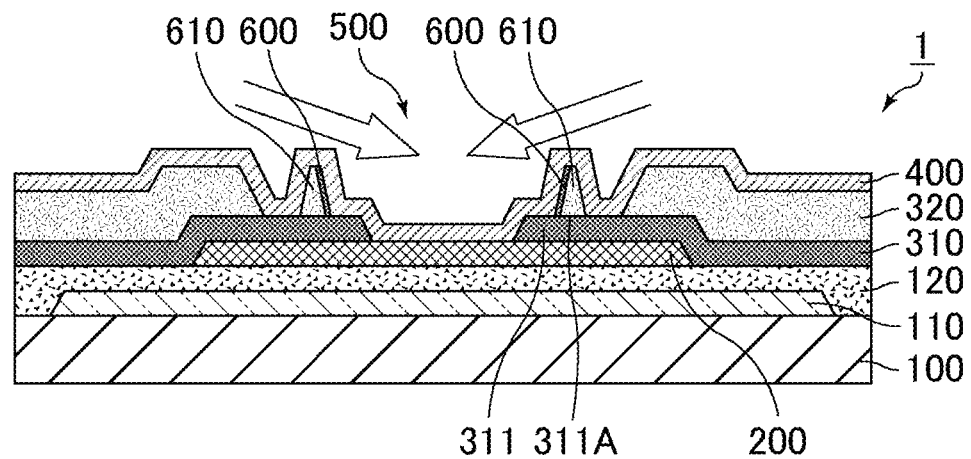
FIG. 3 is a schematic cross-sectional view of an active matrix substrate of Embodiment 3.

The features unique to the present embodiment are mainly described in the present embodiment, and the same features as those in the above embodiment(s) will not be elaborated upon here. FIG. 3 is a schematic cross-sectional view of an active matrix substrate of Embodiment 3. The active matrix substrate of the present embodiment has the same structure as in the active matrix substrate 1 of Embodiment 1 except that a wall located apart from the second insulating film is further disposed on the upper surface portion of the protrusion of the first insulating film.

As shown in FIG. 3, the active matrix substrate 1 of the present embodiment further includes a wall 610 located apart from the second insulating film 320 on the upper surface portion 311A of the protrusion 311. In this embodiment, the wall 610 can prevent a material such as an alignment film material from flowing into the hole 500 as shown by the arrows in FIG. 3 when the material such as an alignment film material is applied to the active matrix substrate 1.

The wall 610 has a height whose value is similar to that of the thickness of the second insulating film 320 and is a wall-shaped member disposed separately from the second insulating film 320. The wall 610 includes the modified layer 600 containing a material different from the material of the second insulating film 320 on the side remote from the second insulating film 320 and a layer containing the material of the second insulating film 320 on the second insulating film 320 side surface.

Although there is a gap between the wall 610 and the second insulating film 320 in the present embodiment, the wall causing the gap has a height whose value is similar to that of the thickness of the second insulating film 320, which can provide improved coating quality and adhesiveness of the upper layer 400 compared with Comparative Embodiment 1.

Embodiment 4

Figure 4:
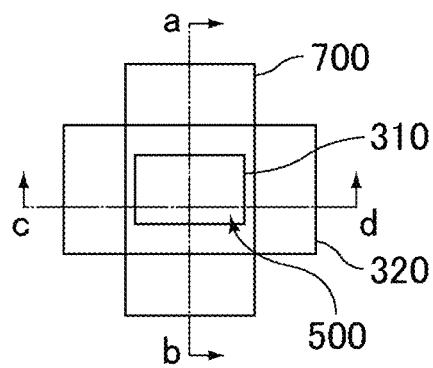
FIG. 4 includes drawings relating to an active matrix substrate of Embodiment 4.
Figure 4:
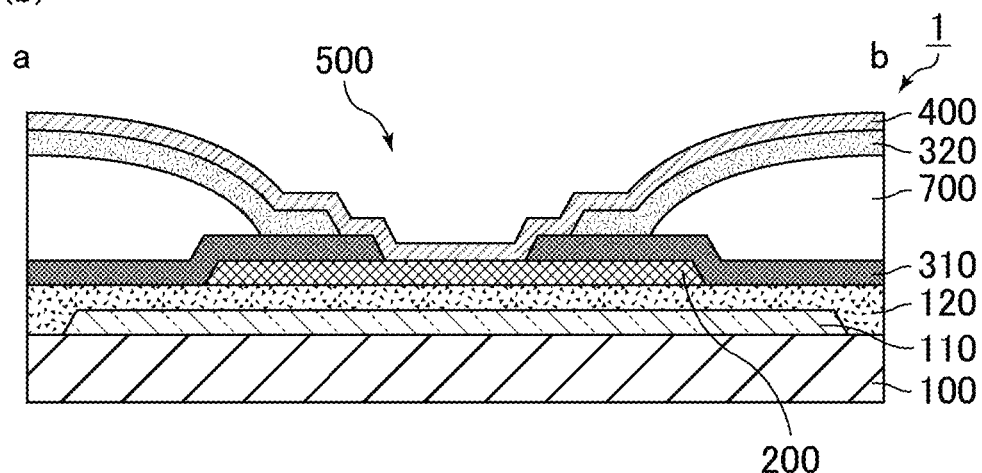
Figure 4:
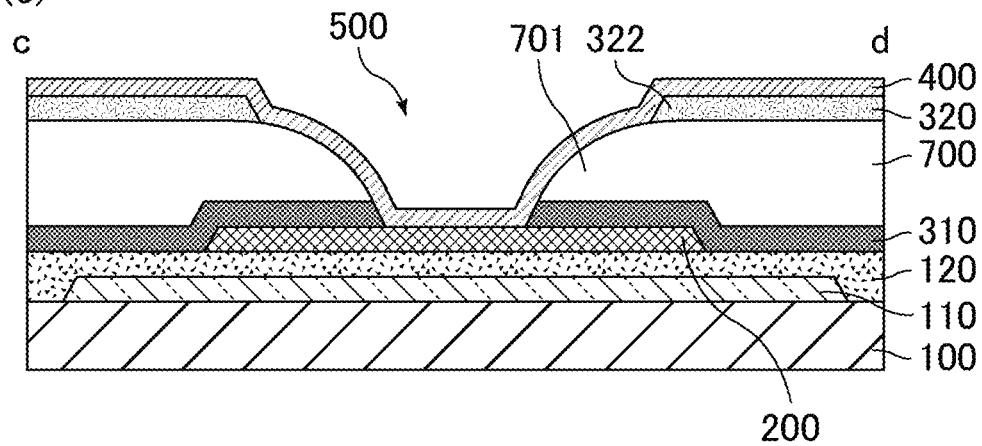

The features unique to the present embodiment are mainly described in the present embodiment, and the same features as those in the above embodiment(s) will not be elaborated upon here. FIG. 4 includes drawings relating to an active matrix substrate of Embodiment 4: FIG. 4(a) is a schematic plan view of a region including a hole; FIG. 4(b) is a schematic cross-sectional view taken along the line a-b in FIG. 4(a); and FIG. 4(c) is a schematic cross-sectional view taken along the line c-d in FIG. 4(a). FIG. 4(a) shows the outlines of the edges of the respective members. The active matrix substrate of the present embodiment has the same structure as in the active matrix substrate 1 of Embodiment 1 except that an organic insulating film is disposed between the first insulating film and the second insulating film.

As shown in FIGS. 4(b) and 4(c), the active matrix substrate 1 of the present embodiment has a structure in which an organic insulating film 700 is further disposed between the first insulating film 310 and the second insulating film 320 of Embodiment 1. The hole 500 of the active matrix substrate 1 of the present embodiment includes a region where the organic insulating film 700 is coated with the second insulating film 320 as shown in FIGS. 4(a) and 4(b) and a region where the organic insulating film 700 is not coated with the second insulating film 320 as shown in FIGS. 4(a) and 4(c).

As shown in FIG. 4(b), in the a-b direction, the organic insulating film 700 is coated with the second insulating film 320. Thus, in the region with the hole 500, the first insulating film 310 and the second insulating film 320 form a stepwise pattern as in Embodiment 1. Thereby, the size of the hole 500 of the active matrix substrate 1 of the present embodiment can be reduced in the a-b direction and the coating quality and adhesiveness of the upper layer 400 in the region with the hole 500 can be improved.

As shown in FIG. 4(c), in the c-d direction, an end portion of the organic insulating film 700 is not coated with the second insulating film 320, and the hole 500 reaches the lower layer 200 through the first insulating film 310, the second insulating film 320, and the organic insulating film 700. In the region with the hole 500, the organic insulating film 700 includes a protrusion 701 that protrudes from a second end portion 322 of the second insulating film 320.

Generally, an organic insulating film has a relatively low selectivity, i.e., tends to be etched. Thus, when the exposed area of the organic insulating film 700 increases in the later-described production process of the active matrix substrate 1, especially in the dry etching of the first insulating film 310 and the second insulating film 320 before formation of the upper layer 400, the etching rate of the second insulating film 320 decreases. Accordingly, the shift amount of the second insulating film 320 in the dry etching performed after the organic insulating film 700 is exposed can be more precisely controlled by adjusting the exposed area of the organic insulating film 700.

The active matrix substrate 1 of the present embodiment includes the organic insulating film 700. Accordingly, when the layer coating the stepwise structure (e.g., upper layer 400) is formed from a liquid material, the shape of the hole 500 can be changed according to the wettability of the liquid material. Since the active matrix substrate 1 of the present embodiment includes the organic insulating film 700, the position of the end portion of the organic insulating film 700 in the a-b direction and the exposed width of the organic insulating film 700 in the c-d direction can be appropriately adjusted. As a result, the wettability of the liquid material can be stabilized. Examples of the upper layer 400 formed from the liquid material include an alignment film that is disposed in a layer above the pixel electrodes, a photoresist film formed after formation of the stepwise structure A, and an organic insulating film other than the above-described organic insulating film 700. The upper layer 400 may be one including pixel electrodes and an alignment film that is disposed in a layer above the pixel electrodes. When the upper layer 400 includes an alignment film, the upper layer 400 has a thickness of 0.02 μm or greater and 1.0 μm or smaller, for example. When the upper layer 400 includes an organic insulating film or a photoresist film, the upper layer 400 has a thickness of 0.5 μm or greater and 3.0 μm or smaller, for example.

Examples of the organic insulating film 700 include an organic film having a small relative permittivity (relative permittivity ε=3 to 4) such as a photoreactive acrylic resin film. The organic insulating film 700 may have any thickness and may have a thickness of 0.5 μm or greater and 3.0 μm or smaller, for example.

In the c-d direction of the active matrix substrate 1, the second insulating film 320 partly coats the organic insulating film 700. Accordingly, the first insulating film 310 and the second insulating film 320 fail to form a stepwise structure. In addition, the surface of the organic insulating film 700 is partly etched, whereby a step is formed by the organic insulating film 700 below the side surface closer to the hole 500 of the second insulating film 320. Thus, the coating quality of the upper layer 400 decreases. In addition, when the hole 500 is used as a contact hole, the contact resistance of the upper layer 400 may increase. Meanwhile, in the a-b direction, the first insulating film 310 and the second insulating film 320 can form a stepwise structure, whereby the coating quality and adhesiveness of the upper layer 400 can be improved. As described, in the present embodiment, the substrate is designed such that the shift amount of the second insulating film 320 can be appropriately controlled in the c-d direction and that the size of the hole 500 can be reduced and the coating quality and adhesiveness of the upper layer 400 in the region with the hole 500 can be improved in the a-b direction.

Embodiment 5

Figure 5:
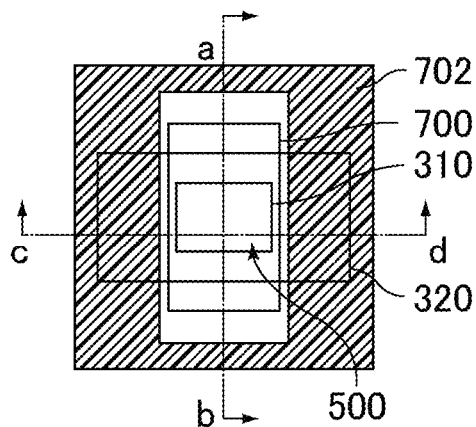
FIG. 5 includes drawings relating to an active matrix substrate of Embodiment 5.
Figure 5:
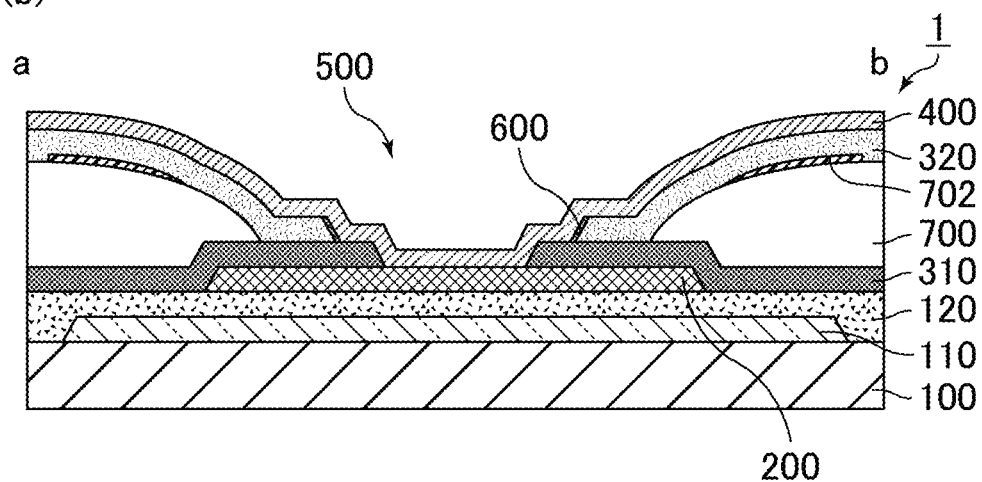
Figure 5:
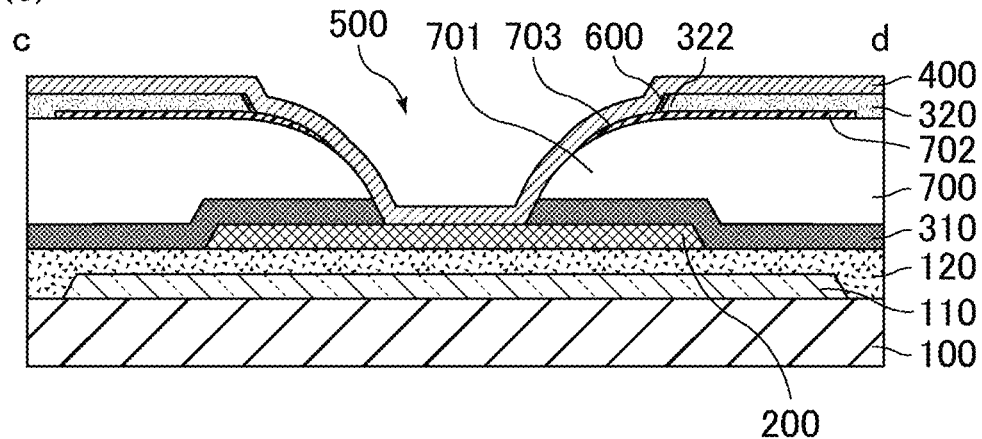

The features unique to the present embodiment are mainly described in the present embodiment, and the same features as those in the above embodiment(s) will not be elaborated upon here. FIG. 5 includes drawings relating to an active matrix substrate of Embodiment 5: FIG. 5(*a*) is a schematic plan view of a region including a hole; FIG. 5(*b*) is a schematic cross-sectional view taken along the line a-b in FIG. 5(*a*); and FIG. 5(*c*) is a schematic cross-sectional view taken along the line c-d in FIG. 5(*a*). FIG. 5(*a*) shows the outlines of the edges of the respective members excepting a transparent conductive layer. The active matrix substrate of the present embodiment has the same structure as in the active matrix substrate 1 of Embodiment 4 except for further including a transparent conductive layer between the first insulating film and the second insulating film.

As shown in FIGS. 5(*b*) and 5(*c*), an active matrix substrate 1 of the present embodiment has a structure in which a transparent conductive film 702 is further disposed on the organic insulating film 700 between the first insulating film 310 and the second insulating film 320. The hole 500 of the active matrix substrate 1 of the present embodiment includes a region where the transparent conductive film 702 is coated with the second insulating film 320 as shown in FIGS. 5(*a*) and 5(*b*) and a region where the transparent conductive film 702 is not coated with the second insulating film 320 as shown in FIGS. 5(*a*) and 5(*c*).

As shown in FIG. 5(*b*), in the a-b direction, the transparent conductive film 702 is coated with the second insulating film 320. Thus, in the region with the hole 500, the first insulating film 310 and the second insulating film 320 form a stepwise pattern as in Embodiment 1. Thereby, the size of the hole 500 of the active matrix substrate 1 of the present embodiment can be reduced in the a-b direction and the coating quality and adhesiveness of the upper layer 400 in the region with the hole 500 can be improved. Also, the side surface closer to the hole 500 of the second insulating film 320 includes the modified layer 600. Thus, in the later-described production process of the active matrix substrate 1, the shift amount can be controlled, which enables reduction in variation of the sizes of the holes 500.

As shown in FIG. 5(*c*), in the c-d direction, an end portion of the transparent conductive film 702 is not coated with the second insulating film 320, and the hole 500 reaches the lower layer 200 through the first insulating film 310, the second insulating film 320, the organic insulating film 700, and the transparent conductive film 702. In the region with the hole 500, the transparent conductive film 702 includes a protrusion 703 that protrudes from the second end portion 322 of the second insulating film 320.

The modified layer 600 containing a modified material of the material of the transparent conductive film 702 can be prevented from being decomposed again. In the later-described production process of the active matrix substrate 1, especially in the dry etching of the first insulating film 310 and the second insulating film 320 before formation of the upper layer 400, when the transparent conductive film 702 is exposed, the transparent conductive film 702 is slightly etched, whereby the modified layer 600 contains a modified material of the material of the transparent conductive film 702. This stabilizes the modified layer 600 and facilitates formation of the modified layer 600.

The transparent conductive film 702 is formed in the same layer as for the common electrode or the pixel electrodes and is patterned separately from the common electrode and the pixel electrodes. In the present embodiment, the organic insulating film 700 is disposed in a layer below the transparent conductive film 702. The organic insulating film 700 may not be disposed. In this case, the transparent conductive film 702 is disposed on the first insulating film 310.

As shown in FIG. 5(*a*), the transparent conductive film 702 of the present embodiment has a cyclic pattern surrounding the hole 500. The transparent conductive film 702 may have a different pattern as long as it has a part not coated with the second insulating film 320. For example, the transparent conductive film 702 may not be disposed in the a-b direction shown in FIG. 5(*a*).

Examples of the material of the transparent conductive film 702 include a transparent conductive film material such as indium tin oxide (ITO), indium zinc oxide (IZO), zinc oxide (ZnO), or tin oxide (SnO) or an alloy of these.

Embodiment 6

Figure 6:
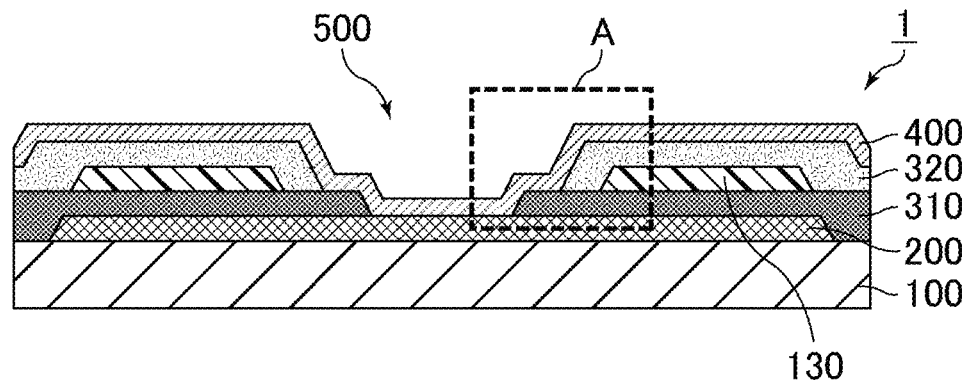
FIG. 6 is a schematic cross-sectional view of an active matrix substrate of Embodiment 6.

The features unique to the present embodiment are mainly described in the present embodiment, and the same features as those in the above embodiment(s) will not be elaborated upon here. FIG. 6 is a schematic cross-sectional view of an active matrix substrate of Embodiment 6.

Embodiment 1 describes an FFS mode liquid crystal display panel that includes pixel electrodes and a common electrode provided with apertures on an active matrix substrate. Alternatively, the pixel electrodes or the common electrode may be disposed on a CF substrate. In the present embodiment, the common electrode is not disposed on the active matrix substrate. In other words, the active matrix substrate of the present embodiment has the same structure as in the active matrix substrate 1 of Embodiment 1 except that the common electrode is disposed on the CF substrate. The present embodiment describes a structure in which pixel electrodes are disposed on an active matrix substrate and a common electrode is disposed on a CF substrate.

As shown in FIG. 6, an active matrix substrate 1 of the present embodiment includes the insulating substrate 100, the lower layer 200 stacked on the insulating substrate 100, the first insulating film 310 stacked on the lower layer 200, the second insulating film 320 stacked on the first insulating film 310, and the upper layer 400 stacked on the second insulating film 320. A source layer electrode 130 is disposed between the first insulating film 310 and the second insulating film 320.

Similarly to Embodiment 1, the first insulating film 310 and the second insulating film 320 form the stepwise structure A.

The lower layer 200 of the present embodiment includes a gate layer electrode and is a layer containing a metal such as titanium, aluminum, molybdenum, copper, or chromium or an alloy of these, i.e., a conductive layer.

The first insulating film 310 is a silicon oxide film functioning as a gate insulating film. Although the present embodiment describes the case where a silicon oxide film is used as the first insulating film 310, the first insulating film 310 is not limited thereto. Descriptions for the second insulating film 320 and the upper layer 400 will not be elaborated upon here because they are the same as those in Embodiment 1.

Embodiment 7

The features unique to the present embodiment are mainly described in the present embodiment, and the same features as those in the above embodiment(s) will not be elaborated upon here. In Embodiment 1, an oxide semiconductor such as an In—Ga—Zn—O-based semiconductor is used for the material of the thin-film semiconductors of the TFTs. Alternatively, a material other than an oxide semiconductor may be used as the material of the thin-film semiconductors. The active matrix substrate of the present embodiment has the same structure as in the active matrix substrate 1 of Embodiment 1 except that the material of the thin-film semiconductors is different.

The thin-film semiconductors in the active matrix substrate of the present embodiment may be amorphous silicon, polysilicon, or the like. This embodiment can also reduce the size of the hole 500 and improve the coating quality and adhesiveness of the upper layer 400 in the region with the hole 500.

Embodiment 8

The features unique to the present embodiment are mainly described in the present embodiment, and the same features as those in the above embodiment(s) will not be elaborated upon here. In the present embodiment, the hole 500 is used as a contact hole for forming a mounting terminal.

Specifically, in the present embodiment, the lower layer 200 functions as a lead line formed from the source layer and/or the gate layer, the upper layer 400 functions as a mounting terminal (electrode pad) containing a transparent conductive film material such as indium tin oxide (ITO), indium zinc oxide (IZO), zinc oxide (ZnO), or tin oxide (SnO) or an alloy of these. In the hole 500, the lead line as the lower layer 200 and the mounting terminal as the upper layer 400 are made in contact with and thereby connected to each other. In the region with the mounting terminal, an electronic component such as a driver or a flexible printed circuit board can be mounted. In this case, a terminal of the electronic component and the mounting terminal of the upper layer 400 are usually connected to each other with an anisotropic conductive film.

Embodiment 9

The features unique to the present embodiment are mainly described in the present embodiment, and the same features as those in the above embodiment(s) will not be elaborated upon here. In the active matrix substrate 1 of Embodiment 1, the hole 500 is used as the contact hole of a TFT in the display region for image display. Alternatively, the hole 500 may be used as a contact hole of a surrounding circuit disposed outside the display region. For example, the hole 500 may be used as a contact hole in a monolithic gate driver that is formed outside the display region.

Embodiment 10

The features unique to the present embodiment are mainly described in the present embodiment, and the same features as those in the above embodiment(s) will not be elaborated upon here. Embodiment 1 describes a bottom gate type substrate in which the semiconductor layers are formed on the gate layer. Alternatively, the present invention may be applied to a top gate type substrate in which the positions of the gate layer and the semiconductor layers are switched.

Embodiment 11

The features unique to the present embodiment are mainly described in the present embodiment, and the same features as those in the above embodiment(s) will not be elaborated upon here. Embodiment 1 describes a structure in which the hole 500 is used as a contact hole. Alternatively, the hole 500 may be used as a ditch into which an alignment film material to be applied to the active matrix substrate 1 is flowed. Thereby, the hole 500 can control the region where the alignment film material is applied. In the present embodiment, the region with the hole 500 includes no lower layer 200 or gate layer electrode 110. Thus, the hole 500 reaches the insulating substrate 100 through the gate insulating film 120, the first insulating film 310, and the second insulating film 320. The upper layer 400 includes an alignment film and is in contact with the insulating substrate 100 in the region with the hole 500.

Embodiment 12

The features unique to the present embodiment are mainly described in the present embodiment, and the same features as those in the above embodiment(s) will not be elaborated upon here. In the active matrix substrate of the present embodiment, oxide semiconductor TFTs and crystalline silicon TFTs are disposed on the same substrate. The active matrix substrate includes a TFT (pixel TFT) for each pixel. Examples of the pixel TFT include an oxide semiconductor TFT whose active layer is an In—Ga—Zn—O-based semiconductor film. On the substrate with the pixel TFTs, a part or the whole of a surrounding drive circuit may be monolithically formed.

Such an active matrix substrate is referred to as a driver monolithic active matrix substrate. In a driver monolithic active matrix substrate, the surrounding drive circuit is disposed in a region (non-display region or frame region) other than the region with pixels (display region). TFTs (circuit TFTs) constituting the surrounding drive circuit may be, for example, crystalline silicon TFTs whose active layer is a polycrystalline silicon film. Using oxide semiconductor TFTs as pixel TFTs and crystalline silicon TFTs as circuit TFTs as described can reduce the power consumption in the display region and can reduce the size of the frame region.

Figure 7:
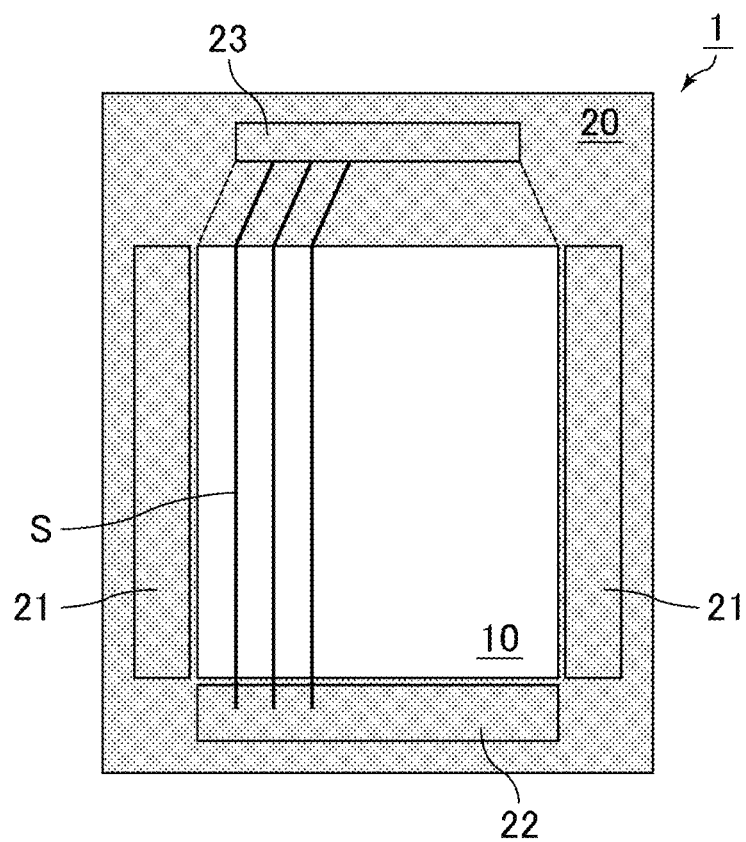
FIG. 7 is a schematic plan view showing an exemplary plan structure of an active matrix substrate of Embodiment 12.
Figure 8:
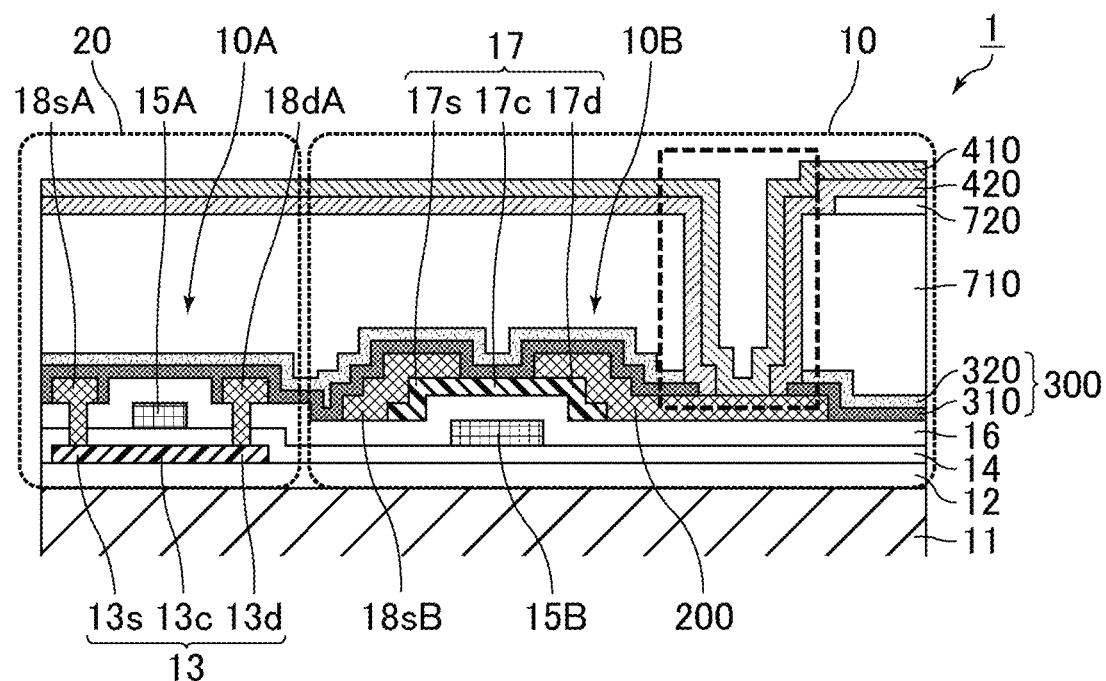
FIG. 8 includes drawings relating to the active matrix substrate of Embodiment 12.
Figure 8:
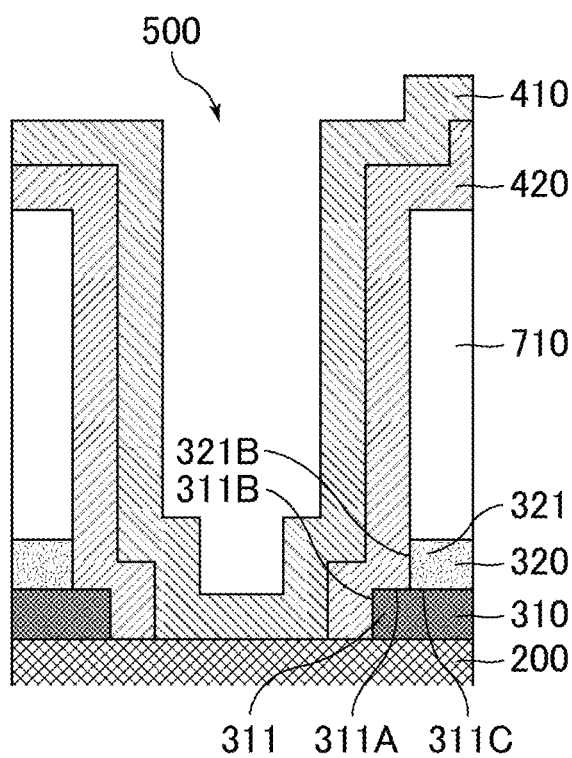

A more specific structure of the active matrix substrate of the present embodiment is described with reference to the drawings. FIG. 7 is a schematic plan view showing an exemplary plan structure of an active matrix substrate of Embodiment 12. FIG. 8 includes drawings relating to the active matrix substrate of Embodiment 12: FIG. 8(a) is a schematic cross-sectional view showing a crystalline silicon TFT and an oxide semiconductor TFT of the active matrix substrate; and FIG. 8(b) is an enlarged schematic cross-sectional view of a contact hole part. FIG. 8(b) is a schematic cross-sectional view of a stepwise structure part surrounded by the broken line in FIG. 8(a). Hereinafter, the crystalline silicon TFT is also referred to as a "first thin-film transistor". The oxide semiconductor TFT is also referred to as a "second thin-film transistor".

As shown in FIG. 7, the active matrix substrate 1 includes a display region 10 including pixels and a region (non-display region) other than the display region 10. The non-display region includes a drive circuit formation region 20 in which drive circuits are disposed. The drive circuit formation region 20 is provided with circuits such as a gate driver circuit 21 and a detection circuit 22, for example. The display region 10 includes gate bus lines (not shown) extending in the line direction and source bus lines S extending in the column direction. Although not being shown, the respective pixels are defined by the gate bus lines and the source bus lines S, for example. The gate bus lines are connected to the corresponding terminals of the gate driver circuit. The source bus lines S are connected to the corresponding terminals of a driver IC 23 mounted on the active matrix substrate 1.

As shown in FIG. 8, each pixel of the display region 10 includes a second thin-film transistor 10B as a pixel TFT, and the drive circuit formation region 20 includes a first thin-film transistor 10A as a circuit TFT.

The active matrix substrate 1 includes the substrate 11, a base film 12 formed on a surface of the substrate 11, the first thin-film transistor 10A formed on the base film 12, and the second thin-film transistor 10B formed on the base film 12. The first thin-film transistor 10A includes an active region mainly containing crystalline silicon. The second thin-film transistor 10B includes an active region mainly containing an oxide semiconductor. The first thin-film transistor 10A and the second thin-film transistor 10B are formed monolithically with the substrate 11. The "active region" herein means a region where a channel is formed in the semiconductor layer functioning as an active layer of a TFT.

The first thin-film transistor 10A includes a crystalline silicon semiconductor layer (e.g., low-temperature polysilicon layer) 13 formed on the base film 12, a first insulating layer 14 coating the crystalline silicon semiconductor layer 13, and the gate electrode 15A formed on the first insulating layer 14. A part of the first insulating layer 14 between the crystalline silicon semiconductor layer 13 and the gate electrode 15A functions as a gate insulating film of the first thin-film transistor 10A. The crystalline silicon semiconductor layer 13 includes a region (active region) 13c where a channel is formed and a source region 13s and a drain region 13d on the respective sides of the active region. Here, a part of the crystalline silicon semiconductor layer 13 which is superimposed with the gate electrode 15A via the first insulating layer 14 functions as the active region 13c. The first thin-film transistor 10A further includes a source electrode 18sA and a drain electrode 18dA respectively connected to the source region 13s and the drain region 13d. The source electrode 18sA and the drain electrode 18dA may be disposed on an interlayer insulating film (here, a second insulating layer 16) that covers the gate electrode 15A and the crystalline silicon semiconductor layer 13 and may be connected to the crystalline silicon semiconductor layer 13 in contact holes formed in the interlayer insulating film.

The second thin-film transistor 10B includes a gate electrode 15B formed above the base film 12, a second insulating layer 16 coating the gate electrode 15B, and an oxide semiconductor layer 17 disposed on the second insulating layer 16. As shown, the first insulating layer 14, which functions as a gate insulating film of the first thin-film transistor 10A, may be extended to the region with the second thin-film transistor 10B. In this case, the oxide semiconductor layer 17 may be formed on the first insulating layer 14. A part of the second insulating layer 16 between the gate electrode 15B and the oxide semiconductor layer 17 functions as the gate insulating film of the second thin-film transistor 10B. The oxide semiconductor layer 17 includes a region (active region) 17c where a channel is formed and a source contact region 17s and a drain contact region 17d on the respective sides of the active region. Here, a part of the oxide semiconductor layer 17 which is superimposed with the gate electrode 15B via the second insulating layer 16 functions as an active region 17c. The second thin-film transistor 10B further includes a source electrode 18sB and the lower layer 200 including a drain electrode respectively connected to the source contact region 17s and the drain contact region 17d. The substrate 11 may include no base film 12.

The thin-film transistors 10A and 10B are covered with a passivation film 300 and a flattening film 710. In the second thin-film transistor 10B functioning as a pixel TFT, the gate electrode 15B is connected to the corresponding gate bus line (not shown), the source electrode 18sB is connected to the corresponding source bus line (not shown), and the drain electrode constituting the lower layer 200 is connected to the corresponding pixel electrode constituting a first upper layer 410. In this case, the drain electrode constituting the lower layer 200 is connected to the corresponding pixel electrode constituting the first upper layer 410 in an aperture formed in the passivation film 300 and the flattening film 710. A video signal is supplied to the source electrode 18sB via the corresponding source bus line, and a charge for the pixel electrode is written according to the gate signal supplied from the corresponding gate bus line.

As shown, a transparent conductive layer 720 as a common electrode may be formed on the flattening film 710, and an insulating layer constituting a second upper layer 420 may be formed between the transparent conductive layer (common electrode) 720 and the pixel electrodes constituting the first upper layer 410. In this case, each of the pixel electrodes may be provided with slit apertures. Such an active matrix substrate 1 can be applied to an FFS mode display device, for example.

The FFS mode is a transverse electric field mode in which one of paired substrates is provided with a pair of electrodes and an electric field is applied to liquid crystal molecules in a direction (in a transverse direction) parallel with the substrate surface. This mode generates an electric field represented by electrical flux lines each traveling from a pixel electrode through a liquid crystal layer (not shown) and a slit aperture in the pixel electrode to the common electrode. This electric field contains a transverse component with respect to the liquid crystal layer. As a result, a transverse electric field can be applied to the liquid crystal layer. In a transverse electric field mode, liquid crystal molecules do not rise from the substrate, which advantageously achieves a wide viewing angle compared with a vertical electric field mode.

The structure of the thin-film transistor 10B side active matrix substrate 1 is described. The thin-film transistor 10B side active matrix substrate 1 includes the lower layer 200 including a drain electrode, the first insulating film 310 stacked on the lower layer 200, the second insulating film 320 stacked on the first insulating film 310, the second upper layer 420 stacked above the second insulating film 320, and the first upper layer 410 stacked on the second upper layer 420. The passivation film 300 includes the first insulating film 310 and the second insulating film 320. The active matrix substrate 1 is provided with the hole 500 that reaches the lower layer 200 through the first insulating film 310, the second insulating film 320, and the flattening film 710.

In the region with the hole 500, the first insulating film 310 includes the protrusion 311 that protrudes from the end portion 321 in contact with the first insulating film 310 of the second insulating film 320, whereby the substrate 1 includes a stepwise structure including the protrusion 311 of the first insulating film 310 and the end portion 321 of the second insulating film 320. The first upper layer 410 and the second upper layer 420 both cover the stepwise structure. Especially, the second upper layer 420 of the present embodiment covers the stepwise structure and is in contact with the side surface 321B of the end portion 321 of the second insulating film 320, the upper surface portion 311A and the side surface 311B of the protrusion 311 of the first insulating film 310, and the lower layer 200. The upper surface portion 311A of the first insulating film 310 in the region with the protrusion 311 and the upper surface portion 311C of the first insulating film 310 in the region below the end portion 321 of the second insulating film 320 are coplanar.

The lower layer of the passivation film 300, i.e., the first insulating film 310, constitutes a back channel of the second thin-film transistor 10B, and thus is preferably a silicon oxide film. The upper layer of the passivation film 300, i.e., the second insulating film 320 is preferably a silicon nitride film with a high passivation effect in order to protect the film from moisture and impurities.

In the example shown in the drawing, the first thin-film transistor 10A has a top gate structure in which the crystalline silicon semiconductor layer 13 is disposed between the gate electrode 15A and the substrate 11 (base film 12). In contrast, the second thin-film transistor 10B has a bottom gate structure in which the gate electrode 15B is disposed between the oxide semiconductor layer 17 and the substrate 11 (base film 12). These structures can more effectively reduce the number of the production processes and an increase in cost when two thin-film transistors 10A and 10B are monolithically disposed on the same substrate 11.

The TFT structures of the first thin-film transistor 10A and the second thin-film transistor 10B are not limited to the above. For example, these thin-film transistors 10A and 10B may have the same TFT structure. Alternatively, the first thin-film transistor 10A may have a bottom gate structure and the second thin-film transistor 10B may have a top gate structure. The bottom gate structure may be a channel etched type, such as the structure in the first thin-film transistor 10A, or an etching stop type. Also, a bottom contact type may be employed in which the source electrode and the drain electrode are disposed below the semiconductor layer.

The second insulating layer 16, which is a gate insulating film of the second thin-film transistor 10B, may be extended to the region with the first thin-film transistor 10A, and may function as an interlayer insulating film that covers the gate electrode 15A and the crystalline silicon semiconductor layer 13 of the first thin-film transistor 10A. When the interlayer insulating film of the first thin-film transistor 10A and the gate insulating film of the second thin-film transistor 10B are formed in the same layer (second insulating layer 16), the second insulating layer 16 may have a laminate structure.

The gate electrode 15A of the first thin-film transistor 10A and the gate electrode 15B of the second thin-film transistor 10B may be formed in the same layer. The source electrode 18sA and the drain electrode 18dA of the first thin-film transistor 10A and the lower layer 200 including the source electrode 18sB and the drain electrode of the second thin-film transistor 10B may be formed in the same layer. The phrase "formed in the same layer" herein means that the components are formed from the same film (conductive film). Thereby, the number of production processes and an increase in production cost can be reduced.

The oxide semiconductor layer 17 of the present embodiment includes, for example, an In—Ga—Zn—O-based semiconductor (hereinafter, referred to as a "semiconductor based on In—Ga—Zn—O"). The In—Ga—Zn—O-based semiconductor is a ternary oxide containing indium (In), gallium (Ga), and zinc (Zn). The ratio between In, Ga, and Zn (composition ratio) is not limited and is, for example, In:Ga:Zn=2:2:1, In:Ga:Zn=1:1:1, or In:Ga:Zn=1:1:2.

The In—Ga—Zn—O-based semiconductor may be an amorphous semiconductor or a crystalline semiconductor. The crystalline In—Ga—Zn—O-based semiconductor is preferably a crystalline In—Ga—Zn—O-based semiconductor in which the c axis is substantially vertical to the layer surface. The crystal structure of such an In—Ga—Zn—O-based semiconductor is disclosed in JP 2012-134475 A, for example. For reference, the entire disclosure of JP 2012-134475 A is incorporated herein by reference.

The oxide semiconductor layer 17 may contain a different oxide semiconductor instead of the In—Ga—Zn—O-based semiconductor. Examples thereof include Zn—O-based semiconductors (ZnO), In—Zn—O-based semiconductors (IZO®), Zn—Ti—O-based semiconductors (ZTO), Cd—Ge—O-based semiconductors, Cd—Pb—O-based semiconductors, cadmium oxide (CdO), Mg—Zn—O-based semiconductors, In—Sn—Zn—O-based semiconductors (e.g., $In_2O_3$—$SnO_2$—ZnO), and In—Ga—Sn—O-based semiconductors.

Embodiment 13

Figure 9:
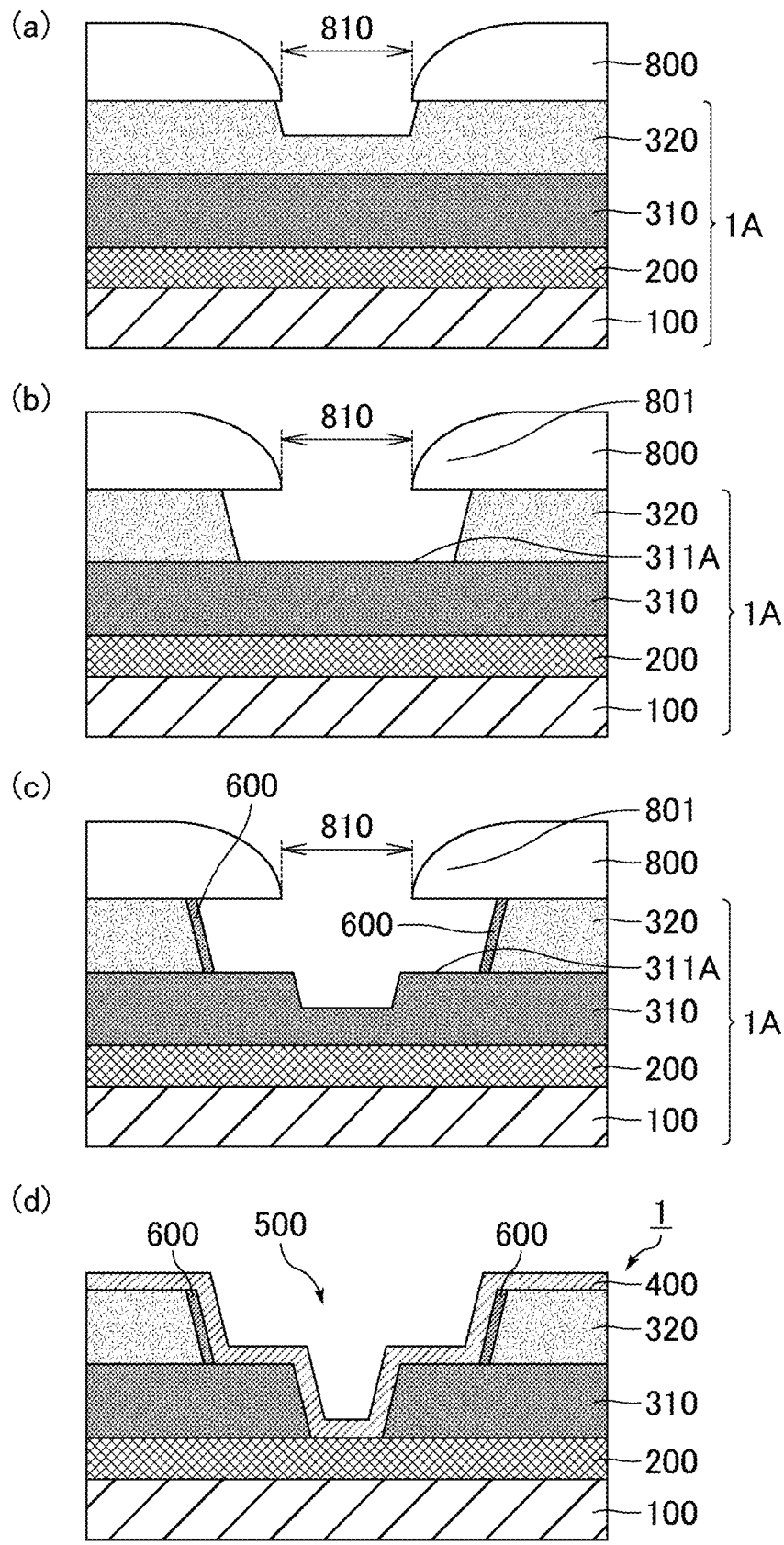
FIG. 9 includes drawings relating to an active matrix substrate production process of Embodiment 13.

The present embodiment describes a method for producing the active matrix substrate 1 of Embodiment 1. FIG. 9 includes drawings relating to the active matrix substrate production process of Embodiment 13: FIG. 9(a) is a schematic cross-sectional view of a workpiece during etching of a second insulating film; FIG. 9(b) is a schematic cross-sectional view of the workpiece with a first insulating film exposed; FIG. 9(c) is a schematic cross-sectional view of the first insulating film during etching; and FIG. 9(d) is a schematic cross-sectional view of a state after upper layer formation.

The active matrix substrate 1 of Embodiment 1 can be produced as follows. First, the gate layer and the gate insulating film 120 are formed on the insulating substrate 100 such as a glass substrate. Then, a single-layer or multilayer film of a metal such as titanium, aluminum, molybdenum, copper, or chromium or an alloy of these is formed by a method such as sputtering and then patterned by a method such as photolithography, whereby the lower layer 200 including the source layer is formed.

Then, on the lower layer 200 is formed the first insulating film 310 by a method such as chemical vapor deposition (CVD) or sputtering. On the first insulating film 310 is then formed the second insulating film 320 by a method such as CVD or sputtering. When the second insulating film 320 is a silicon nitride film, the first insulating film 310 is a silicon oxide film, a silicon nitride film having a lower etching rate (a better film quality) than the second insulating film 320, or a silicon oxynitride film. When the second insulating film 320 is a silicon oxynitride film, the first insulating film 310 is a silicon oxide film or a silicon oxynitride film having a lower etching rate (a better film quality) than the second insulating film 320.

Furthermore, to the second insulating film 320 is applied a photoresist by a method such as spin coating, and the photoresist is exposed to light and developed to be patterned. Thereby, a mask 800 is formed.

Then, an etching step is performed which includes dry etching of a pre-treated substrate 1A prepared above and including the lower layer 200, the first insulating film 310 stacked on the lower layer 200, and the second insulating film 320 stacked on the first insulating film 310 through the mask 800 provided with an aperture 810 to form the hole 500 reaching at least one of the lower layer 200 or the insulating substrate 100 through at least the first insulating film 310 and the second insulating film 320. The etching step includes: first etching as shown in FIGS. 9(a) and (9)b, including etching the second insulating film 320 in the region vertically below the aperture 810 and in the region vertically below an aperture 810 side end portion 801 of the mask 800 using a first etching gas to expose the first insulating film 310; and second etching as shown in FIG. 9(c), including etching the first insulating film 310 in the region vertically below the aperture 810 using a second etching gas to expose at least one of the lower layer 200 or the insulating substrate 100 while keeping the upper surface portion 311A of the first insulating film 310 unetched in the exposed region vertically below the end portion 801 of the mask 800. In this embodiment, the stepwise structure in the active matrix substrate 1 of Embodiment 1 can be readily formed with one mask 800. Here, the phrase "keeping the upper surface portion of the first insulating film unetched in the exposed region vertically below an end portion of a mask" includes not only the case where the upper surface portion is completely unetched, but also the case where the upper surface portion is substantially unetched and the case as described above where the hole side corner of the protrusion 311 (upper part of the hole side end portion of the protrusion 311) of the first insulating film 310 is deformed (e.g., the cases described with reference to FIGS. 1(c), 1(d) and 1(e)).

Through the first etching and the second etching, the stepwise structure is formed. The mask 800 is then removed and the upper layer formation is performed for forming the upper layer 400 that coats the stepwise structure, whereby the active matrix substrate 1 of Embodiment 1 shown in FIG. 9(d) can be produced.

In the first etching, using a first etching gas, the second insulating film 320 is isotropically etched in the region vertically below an aperture 810 of the mask 800 and in the region vertically below the aperture 810 side end portion 801 of the mask 800. In other words, the second insulating film 320 is etched not only in the region vertically below the aperture 810 of the mask 800 but also in the region vertically below the region surrounding the aperture 810 of the mask 800. In the second etching, the first insulating film 310 is anisotropically etched in the region vertically below the aperture 810 while the upper surface portion 311A of the first insulating film 310 is kept unetched in the exposed region vertically below the end portion 801 of the mask 800.

In the first etching and the second etching, examples of the method for dry-etching the first insulating film 310 and the second insulating film 320 include reactive ion etching (RIE) and inductively coupled plasma etching (ICP).

The first etching gas used in the first etching contains preferably $SF_6$, more preferably $SF_6$ and $O_2$. The first etching gas preferably contains 20 mol % or more of $O_2$ relative to the whole amount of the first etching gas. The first etching is preferably performed at a relatively high pressure of the first etching gas, for example, at 20 mTorr or higher.

The second etching gas used in the second etching contains preferably $CF_4$, more preferably $CF_4$ and $O_2$ or Ar. The second etching gas preferably contains 10 mol % or more and 60 mol % or less of $O_2$ or Ar relative to the whole amount of the second etching gas. The second etching is preferably performed at a relatively low pressure of the second etching gas, for example, at 60 mTorr or lower.

These preferred conditions in the first etching and the second etching are applicable to any of the described combinations of the materials of the first insulating film 310 and the second insulating film 320.

In the second etching, some substances attach to the side surface closer to the hole 500 of the second insulating film 320. The substances include substances which are inactive to radicals (ejected particles) and are generated by sputtering during etching of members other than the second insulating film 320, such as the first insulating film 310, and polymer substances which are inactive to radicals (non-volatile polymer) and are generated as reaction products of etching. Thereby, the modified layer 600 is formed. The modified layer 600 can prevent chemical reactions between radicals and the second insulating film 320 in the second etching. As a result, the second insulating film 320 can be prevented from being etched when the first insulating film 310 is etched, whereby variation in shift amount of the second insulating film 320 can be reduced.

In contrast, formation of the modified layer 600 can be prevented by changing the kind of the second etching gas used in the second etching. In the second etching, formation of the modified layer 600 can be more inhibited when the second etching gas contains $CF_4$ and $O_2$ than when the second etching gas contains $CF_4$ and Ar. Formation of the modified layer 600 can also be inhibited by increasing the $O_2$ partial pressure of the second etching gas containing $CF_4$ and $O_2$.

The second insulating film 320 is kept coated with the mask 800 until the second etching is finished. In this embodiment, the modified layer 600 can be formed in a manner connected to the second insulating film 320.

In the upper layer formation, the upper layer 400 including pixel electrodes can be formed by sputtering. Thereby, as shown in FIG. 9(d), the upper layer 400 including pixel electrodes and the lower layer 200 including a source layer electrode are connected in the region with the hole 500.

Embodiment 14

Figure 10:
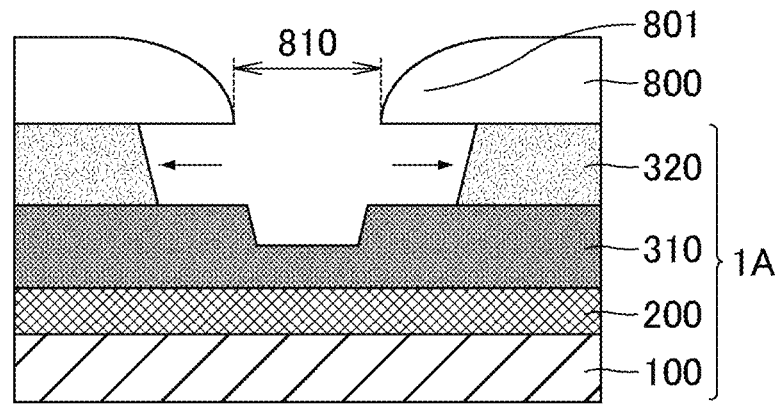
FIG. 10 is a schematic cross-sectional view relating to an active matrix substrate production method of Embodiment 14.

The features unique to the present embodiment are mainly described in the present embodiment, and the same features as those in the above embodiment(s) will not be elaborated upon here. The present embodiment describes a method for controlling the shift amount of the second insulating film 320. FIG. 10 is a schematic cross-sectional view relating to an active matrix substrate production of Embodiment 14.

The first etching is performed until at least the first insulating film 310 is exposed. Meanwhile, in the method for producing an active matrix substrate of the present embodiment, as shown in FIG. 10, in the first etching, the exposed region of the first insulating film 310 vertically below the aperture 810 is partly etched. In other words, in the first etching of the method for producing an active matrix substrate of the present embodiment, etching continues even after the exposure of the first insulating film 310 (over etching is performed). This embodiment can increase the setback distance of the second insulating film 320 from the end portion 801 of the mask 800. In other words, controlling the over etching duration can control the shift amount, i.e., the amount the second insulating film 320 is etched in the setback direction (the arrow directions in the drawing) from the region vertically below the aperture of the mask.

The shift amount of the second insulating film 320 can also be appropriately adjusted by changing the tapered angle of the resist film that is placed on the second insulating film 320 when the second insulating film 320 is etched.

Embodiment 15

Figure 11:
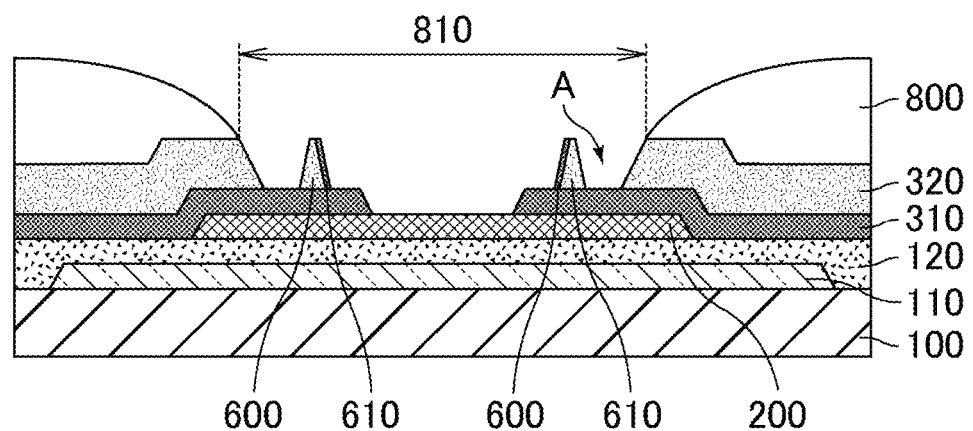
FIG. 11 is a schematic cross-sectional view relating to an active matrix substrate production method of Embodiment 15.

The features unique to the present embodiment are mainly described in the present embodiment, and the same features as those in the above embodiment(s) will not be elaborated upon here. The present embodiment describes a method for producing the active matrix substrate 1 of Embodiment 3. FIG. 11 is a schematic cross-sectional view relating to the active matrix substrate production method of Embodiment 15.

As described in Embodiment 13, coating the second insulating film 320 with the mask 800 until the second etching is finished can form a structure in which the modified layer 600 and the second insulating film 320 are connected to each other. In contrast, in the present embodiment, as shown in FIG. 11, in the second etching, the second insulating film 320 is etched while the mask 800 is etched to expand the aperture 810 until the modified layer 600 and part of the second insulating film 320 is exposed from the mask 800. In other words, the selectivity of the mask 800 is reduced, and the mask 800 as well as the first insulating film 310 is purposely etched and is thereby shifted. Then, the end portion of the second insulating film 320 exposed from the mask 800 is etched. Here, the modified layer 600 and part of the second insulating film 320 adjacent to the modified layer 600 are not etched but remain on the first insulating film 310. As a result, a wall 610 located apart from the second insulating film 320 and the stepwise structure A formed by the first insulating film 310 and the second insulating film 320 can be formed. Thereby, when a material such as an alignment film material is applied to the active matrix substrate 1, the wall 610 can prevent the alignment film material from flowing into the hole 500.

In addition, sufficiently reducing the etching rate of the first insulating film 310 compared with the etching rate of the second insulating film 320 can prevent the protrusion 311 of the first insulating film 310 from being etched. Thus, adjusting the shift amount of the mask 800 can form the stepwise structure A. Alternatively, the stepwise structure A can be formed by coating the second insulating film 320 with the mask 800 until the second etching is finished, shifting only the edge of the mask 800 by $O_2$ ashing or the like to expand the aperture 810 and thereby to expose the end portion of the second insulating film 320, and dry-etching only the second insulating film 320.

Embodiment 16

The features unique to the present embodiment are mainly described in the present embodiment, and the same features as those in the above embodiment(s) will not be elaborated upon here. The present embodiment describes a method for producing the active matrix substrate 1 of Embodiment 4.

Figure 12:
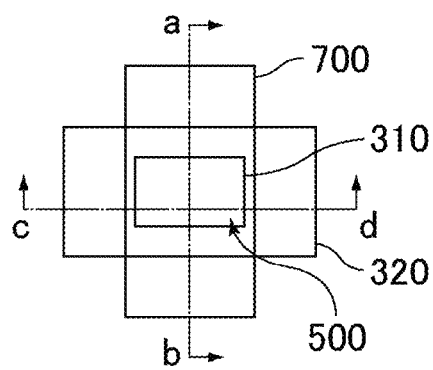
FIG. 12 includes drawings relating to an active matrix substrate production method of Embodiment 16.
Figure 12:
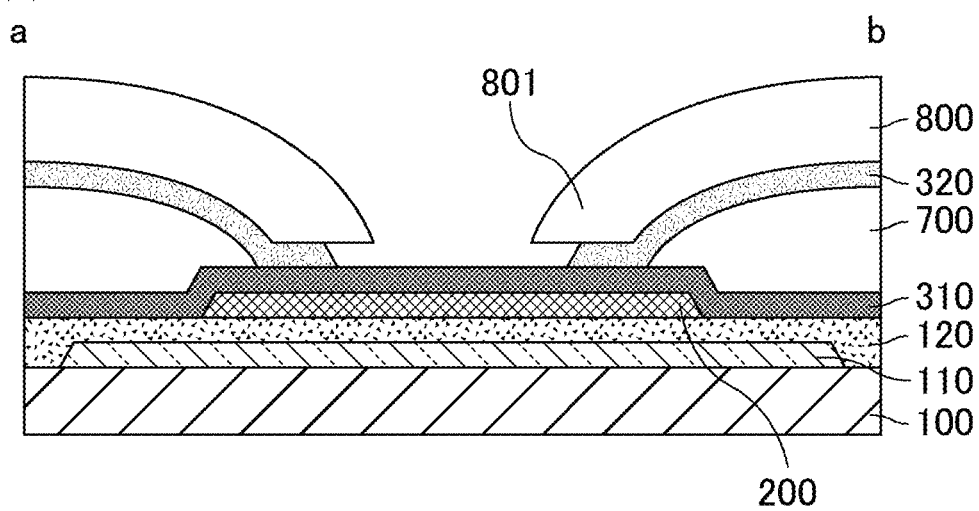
Figure 12:
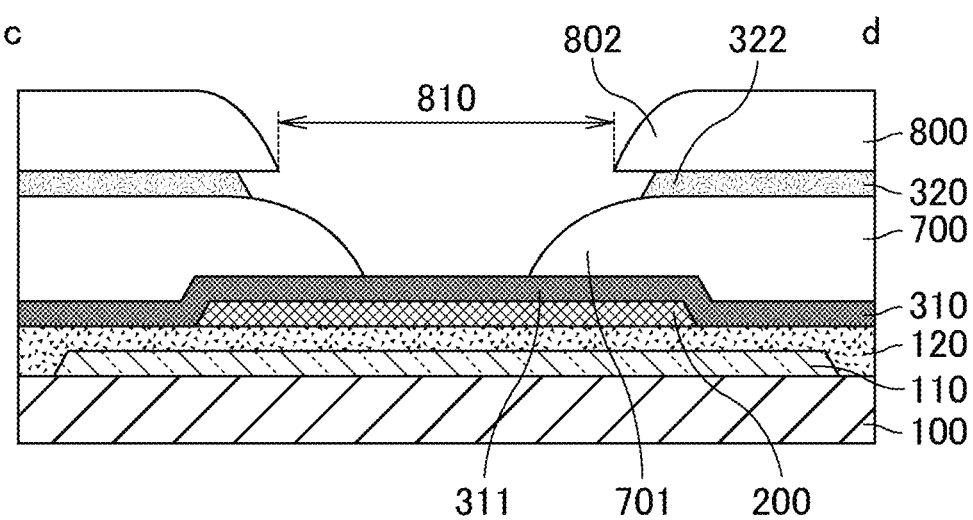

FIG. 12 includes drawings relating to the active matrix substrate production method of Embodiment 16: FIG. 12(a) is a schematic plan view of a region including a hole; FIG. 12(b) is a schematic cross-sectional view taken along the line a-b in FIG. 12(a); and FIG. 12(c) is a schematic cross-sectional view taken along the line c-d in FIG. 12(a).

In the present embodiment, when the second etching is finished, the organic insulating film 700 is exposed below the aperture 810 of the mask 800 in the c-d direction while the organic insulating film 700 is not exposed in the a-b direction.

The active matrix substrate 1 of Embodiment 4 can be produced as follows. First, in the same manner as in Embodiment 13, the gate layer and the gate insulating film 120 are formed on the insulating substrate 100, and the lower layer 200 and the first insulating film 310 containing $SiO_2$ are sequentially formed.

To the first insulating film 310 is applied an organic insulating film material that is a photoresist by a method such as spin coating, and the organic insulating film material is exposed to light and developed to be patterned, whereby the organic insulating film 700 is formed. Then, in the same manner as in Embodiment 13, on the organic insulating film 700 are sequentially formed the second insulating film 320 and the mask 800. In the a-b direction, the end portion 801 of the mask 800 on the aperture 810 side is placed in a region where the first insulating film 310 and the second insulating film 320 are in contact with each other, while in the c-d direction, a second end portion 802 of the mask 800 on the aperture 810 side is placed in a region where the second insulating film 320 and the organic insulating film 700 are in contact with each other.

Next, in the first etching (isotropic etching of the second insulating film 320), in the c-d direction, as shown in FIG. 12(c), the first insulating film 310 and the organic insulating film 700 are exposed in the region vertically below the aperture 810 and the organic insulating film 700 is exposed in the region vertically below the aperture 810 side second end portion 802 of the mask 800. Then, the etching of the second insulating film 320 continues even after the exposure of the organic insulating film 700. Meanwhile, in the a-b direction, as shown in FIG. 12(b), the first insulating film 310 is exposed in the region vertically below the aperture 810 and the end portion 801 of the mask 800 in the same manner as in Embodiment 13.

Then, the second etching and the following processes are performed in the same manner as in Embodiment 13, whereby the active matrix substrate 1 of Embodiment 4 can be produced.

Generally, an organic insulating film has a relatively low selectivity, i.e., tends to be etched. Thus, when the exposed area of the organic insulating film 700 increases, the etching rate of the second insulating film 320 decreases. Accordingly, in the present embodiment, the shift amount of the second insulating film 320 in the first etching and the second etching, which are performed after the organic insulating film 700 is exposed, can be more precisely controlled by adjusting the exposed area of the organic insulating film 700.

Embodiment 17

The features unique to the present embodiment are mainly described in the present embodiment, and the same features as those in the above embodiment(s) will not be elaborated upon here. The present embodiment describes a method for producing the active matrix substrate 1 of Embodiment 5.

The active matrix substrate 1 of Embodiment 5 can be produced in the same manner as in the method for producing an active matrix substrate of Embodiment 16, except that a transparent conductive film 702 having the above described pattern is formed on the organic insulating film 700. The active matrix substrate 1 can be specifically produced as follows.

In the same manner as in Embodiment 13, the gate layer and the gate insulating film 120 are formed on the insulating substrate 100, and the lower layer 200 and the first insulating film 310 containing $SiO_2$ are sequentially formed.

To the first insulating film 310 is applied an organic insulating film material that is a photoresist by a method such as spin coating, and the organic insulating film material is exposed to light and developed to be patterned, whereby the organic insulating film 700 is formed.

Then, on the organic insulating film 700 is formed a transparent conductive film 702. The transparent conductive film 702 can be formed by forming a transparent conductive film on the organic insulating film 700 by a method such as sputtering and patterning the film by a method such as photolithography. The transparent conductive film 702 is preferably simultaneously formed with the common electrode or the pixel electrodes.

Next, on the transparent conductive film 702 are sequentially formed the second insulating film 320 and the mask 800. In the a-b direction, the aperture 810 side end portion 801 of the mask 800 is placed in a region where the first insulating film 310 and the second insulating film 320 are in contact with each other, while in the c-d direction, the second end portion 802 of the mask 800 on the aperture 810 side is placed in a region where the second insulating film 320 and the transparent conductive film 702 are in contact with each other.

Figure 13:
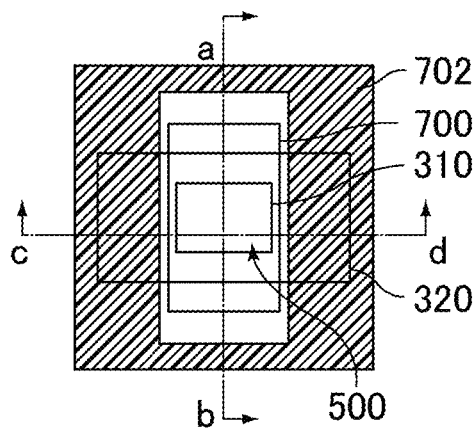
FIG. 13 includes drawings relating to an active matrix substrate production method of Embodiment 17.
Figure 13:
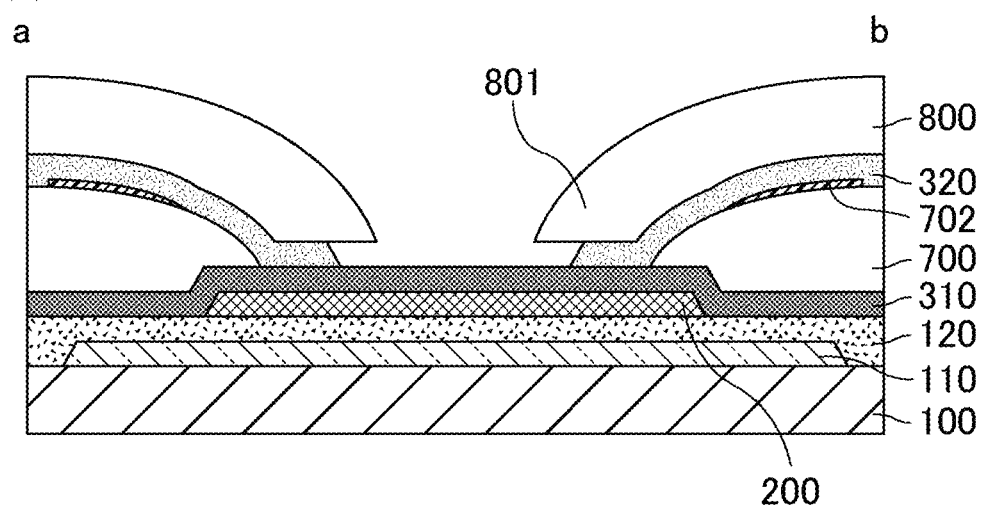
Figure 13:
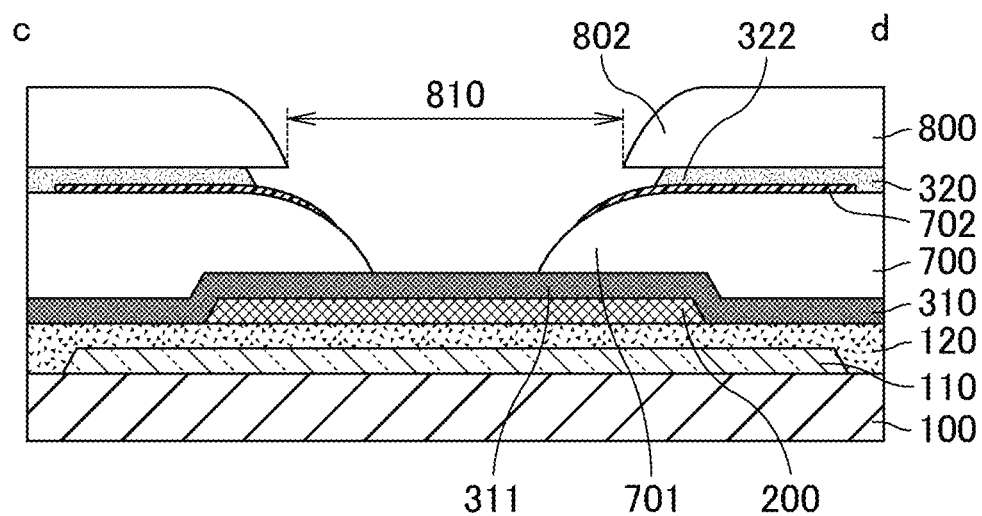
Figure 14:
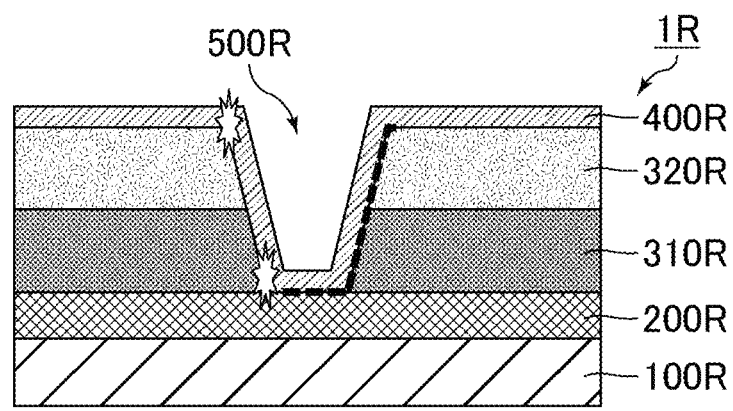
FIG. 14 is a schematic cross-sectional view of an active matrix substrate of Comparative Embodiment 1.
Figure 15:
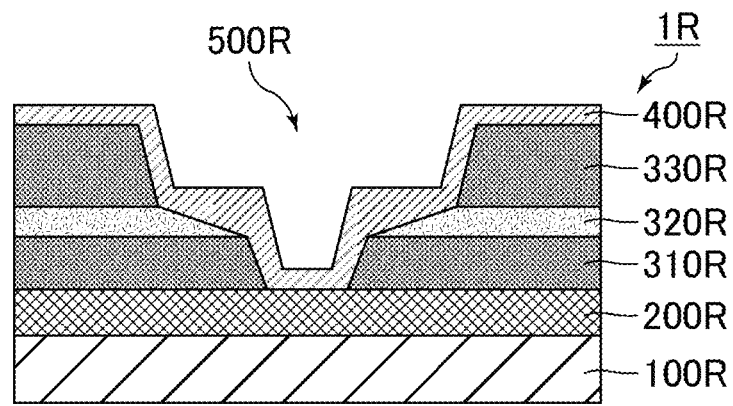
FIG. 15 is a schematic cross-sectional view of an active matrix substrate of Comparative Embodiment 2.

Next, in the first etching (isotropic etching of the second insulating film 320), in the c-d direction, as shown in FIG. 13(c), the first insulating film 310 and the transparent conductive film 702 are exposed in the region vertically below the aperture 810 and the transparent conductive film 702 is exposed in the region vertically below the aperture 810 side second end portion 802 of the mask 800. Then, the etching of the second insulating film 320 continues even after the exposure of the transparent conductive film 702. Meanwhile, in the a-b direction, as shown in FIG. 13(b), the first insulating film 310 is exposed in the region vertically below the aperture 810 and the end portion 801 of the mask 800 in the same manner as in Embodiment 13.

Then, the second etching and the following processes are performed in the same manner as in Embodiment 13, whereby the active matrix substrate 1 of Embodiment 5 can be produced.

The modified layer 600 containing a modified material of the material of the transparent conductive film 702 can be prevented from being decomposed again. In the dry etching of the first insulating film 310 and the second insulating film 320, when the transparent conductive film 702 is exposed, the transparent conductive film 702 is slightly etched, whereby the modified layer 600 contains a modified material of the material of the transparent conductive film 702. This stabilizes the modified layer 600 and facilitates formation of the modified layer 600.

[Additional Remarks]

An aspect of the present invention may be the substrate 1 including: the insulating substrate 100; the lower layer 200 stacked above the insulating substrate 100; the first insulating film 310 stacked on the lower layer 200; the second insulating film 320 stacked on the first insulating film 310; and the upper layer 400 stacked on the second insulating film 320, the substrate 1 being provided with the hole 500 reaching at least one of the lower layer 200 or the insulating substrate 100 through at least the first insulating film 310 and the second insulating film 320, the first insulating film 310 including in a region with the hole 500 the protrusion 311 that protrudes from the end portion 321 in contact with the first insulating film 310 of the second insulating film 320, the substrate 1 including the stepwise structure A including the protrusion 311 of the first insulating film 310 and the end portion 321 of the second insulating film 320, the upper layer 400 coating the stepwise structure A, the upper surface portion 311A of the first insulating film 310 in a region with the protrusion 311 and the upper surface portion 311C of the first insulating film 310 in a region below the end portion 321 of the second insulating film 320 being coplanar.

As described, in the region with the hole 500, the first insulating film 310 protrudes from the end portion 321 in contact with the first insulating film 310 of the second insulating film 320, whereby the stepwise structure A is formed which includes the protrusion 311 of the first insulating film 310 and the end portion 321 of the second insulating film 320. Then, the upper layer 400 is formed so as to coat the stepwise structure A. Thereby, the upper layer 400 coats not one large step consisting of multiple insulating films but two relatively small steps consisting of the first insulating film 310 and the second insulating film 320, which improves the coating quality and adhesiveness of the upper layer 400. The structure with the upper layer 400 coating the stepwise structure A enables the first insulating film 310 and the second insulating film 320 to respectively have a comparatively steep side surfaces 311B and 321B on the side closer to the hole 500 while keeping the coating quality and adhesiveness of the upper layer 400. Since the upper layer 400 is excellent in adhesiveness, corrosion and film peeling can be prevented which are caused by penetration of chemicals or the like due to reduced adhesiveness of the upper layer 400.

Furthermore, the upper surface portion of the first insulating film 310 is located on one plane in the outside (the hole 500 side) region and in the inside (the side remote from the hole 500) region of the end portion 321 of the second insulating film 320. Specifically, the upper surface portion 311A of the first insulating film 310 in the region with the protrusion 311 and the upper surface portion 311C of the first insulating film 310 in the region below the end portion 321 of the second insulating film 320 are coplanar. This embodiment eliminates the need for forming a widely tapered shape on the upper surface portion of the first insulating film 310 in the region with the protrusion 311. Thereby, the end portion 321 of the second insulating film 320 on the first insulating film 310 can appropriately come close to the side surface 311B closer to the hole 500 of the first insulating film 310. As a result, the insulating films can each have a comparatively steep side surface 311B or 321B on the side closer to the hole 500 and the size of the hole 500 can also be reduced.

The substrate 1 may further include on a side surface closer to the hole 500 of the second insulating film 320 the modified layer 600 containing a material different from a material of the second insulating film 320. In this embodiment, the shift amount of the second insulating film 320 can be controlled and thus the positional variation of the end portion 321 of the second insulating film 320, i.e., the variation in sizes of the holes 500, can be reduced.

The substrate 1 may further include on the upper surface portion 311A of the protrusion 311 the wall 610 located apart from the second insulating film 320. In this embodiment, when a material such as an alignment film material is applied to the substrate 1, the wall 610 can prevent the material such as an alignment film material from flowing into the hole 500.

The wall 610 may include the modified layer 600 containing a material different from a material of the second insulating film 320 on a side remote from the second insulating film 320.

The second insulating film 320 may be a silicon nitride film, and the first insulating film 310 may be a silicon oxide film, a silicon nitride film having a lower etching rate than the second insulating film 320, or a silicon oxynitride film. In this embodiment, the stepwise structure A tends to be formed by a method for producing the substrate 1, which is another aspect of the present invention.

The second insulating film 320 may be a silicon oxynitride film, and the first insulating film 310 may be a silicon oxide film or a silicon oxynitride film having a lower etching rate than the second insulating film 320. In this embodiment, the stepwise structure A tends to be formed by a method for producing the substrate 1, which is another aspect of the present invention.

The substrate 1 may further include an organic insulating film 700 between the first insulating film 310 and the second insulating film 320, the hole 500 may reach at least one of the lower layer 200 or the insulating substrate 100 through the first insulating film 310, the second insulating film 320, and the organic insulating film 700, and the organic insulating film 700 may include in the region with the hole 500 the protrusion 701 that protrudes from the second end portion 322 of the second insulating film 320.

Generally, an organic insulating film has a relatively low selectivity, i.e., tends to be etched. Thus, in the production process of the substrate 1, when the exposed area of the organic insulating film 700 increases, the etching rate of the second insulating film 320 decreases. As a result, the shift amount of the second insulating film 320 in the first etching and the second etching, which are performed after the organic insulating film 700 is exposed, can be more precisely controlled by adjusting the exposed area of the organic insulating film 700.

The substrate 1 may further include a transparent conductive film 702 between the first insulating film 310 and the second insulating film 320, and the transparent conductive film 702 may include in the region with the hole 500 the protrusion 703 that protrudes from the second end portion 322 of the second insulating film 320.

The modified layer 600 containing a modified material of the material of the transparent conductive film 702 can be prevented from being decomposed again. In the production process of the substrate 1, especially in the dry etching of the first insulating film 310 and the second insulating film 320 before formation of the upper layer 400, when the transparent conductive film 702 is exposed, the transparent conductive film 702 is slightly etched, whereby the modified layer 600 contains a modified material of the material of the transparent conductive film 702. This stabilizes the modified layer 600 and facilitates formation of the modified layer 600.

Another aspect of the present invention may be the method for producing a substrate, including: an etching step including dry-etching the pre-treated substrate 1A including the insulating substrate 100, the lower layer 200 stacked above the insulating substrate 100, the first insulating film 310 stacked on the lower layer 200, and the second insulating film 320 stacked on the first insulating film 310 through the mask 800 provided with the aperture 810 to form the hole 500 reaching at least one of the lower layer 200 or the insulating substrate 100 through at least the first insulating film 310 and the second insulating film 320, the etching step including: first etching including etching the second insulating film 320 in a region vertically below the aperture 810 and in a region vertically below the aperture 810 side end portion 801 of the mask 800 using a first etching gas to expose the first insulating film 310; and second etching including etching the first insulating film 310 in a region vertically below the aperture 810 using a second etching gas to expose at least one of the lower layer 200 or the insulating substrate 100 while keeping the upper surface portion 311A of the first insulating film 310 unetched in an exposed region vertically below the end portion 801 of the mask 800. In this embodiment, the hole 500 can be formed in the first insulating film 310 and the second insulating film 320 at once by dry etching, whereby the stepwise structure A in an aspect of the present invention can be readily formed.

In the first etching, the first insulating film 310 in the exposed region vertically below the aperture 810 may be partly etched. This embodiment can control the shift amount of the second insulating film 320.

In the second etching, the modified layer 600 containing a material different from a material of the second insulating film 320 may be formed on a side surface closer to the hole 500 of the second insulating film 320. In this embodiment, the second insulating film 320 can be prevented from being etched when the first insulating film 310 is etched, whereby variation in shift amount of the second insulating film 320 can be reduced.

The second insulating film 320 may be kept coated with the mask 800 until the second etching is finished. In this embodiment, the modified layer 600 can be formed in a manner connected to the second insulating film 320.

In the second etching, the second insulating film 320 may be etched while the mask 800 is etched to expand the aperture 810 until the modified layer 600 and part of the second insulating film 320 are exposed from the mask 800. In this embodiment, the wall 610 located apart from the second insulating film 320 can be formed. As a result, when a material such as an alignment film material is applied to the substrate, the wall 610 can prevent the material such as an alignment film material from flowing into the hole 500.

The first etching gas may contain $SF_6$ and $O_2$, and the second etching gas may contain $CF_4$ and $O_2$ or Ar.

The first etching gas may contain 20 mol % or more of $O_2$ relative to a whole amount of the first etching gas.

The second etching gas may contain 10 mol % or more and 60 mol % or less of $O_2$ or Ar relative to a whole amount of the second etching gas.

The pre-treated substrate 1A may further include the organic insulating film 700 between the first insulating film 310 and the second insulating film 320, and in the first etching, the first insulating film 310 and the organic insulating film 700 may be exposed in the region vertically below the aperture 810, the organic insulating film 700 may be exposed in the region vertically below the second end portion 802 closer to the aperture 810 of the mask 800, and etching of the second insulating film 320 may continue even after exposure of the organic insulating film 700.

Generally, an organic insulating film has a relatively low selectivity, i.e., tends to be etched. Thus, in the production process of the substrate 1, when the exposed area of the organic insulating film 700 increases, the etching rate of the second insulating film 320 decreases. As a result, the shift amount of the second insulating film 320 in the first etching and the second etching, which are performed after the organic insulating film 700 is exposed, can be more precisely controlled by adjusting the exposed area of the organic insulating film 700.

The pre-treated substrate 1A may further include the transparent conductive film 702 between the first insulating film 310 and the second insulating film 320, and in the first etching, the first insulating film 310 and the transparent conductive film 702 may be exposed in the region vertically below the aperture 810, the transparent conductive film 702 may be exposed in the region vertically below the second end portion 802 closer to the aperture 810 of the mask 800, and etching of the second insulating film 320 may continue even after exposure of the transparent conductive film 702.

The modified layer 600 containing a modified material of the material of the transparent conductive film 702 can be prevented from being decomposed again. In the dry etching of the first insulating film 310 and the second insulating film 320, when the transparent conductive film 702 is exposed, the transparent conductive film 702 is slightly etched, whereby the modified layer 600 contains a modified material of the material of the transparent conductive film 702. This stabilizes the modified layer 600 and facilitates formation of the modified layer 600.

REFERENCE SIGNS LIST 1, 1R: Active matrix substrate (substrate)
1A: Pre-treated substrate
10: Display region
10A: First thin-film transistor
10B: Second thin-film transistor
11: Substrate
12: Base film
13: Crystalline silicon semiconductor layer
13c: Active region
13d: Drain region
13s: Source region
14: First insulating layer
15A, 15B: Gate electrode
16: Second insulating layer
17: Oxide semiconductor layer
17c: Active region
17d: Drain contact region
17s: Source contact region
18sA, 18sB: Source electrode
18dA: Drain electrode
20: Drive circuit formation region
21: Gate driver circuit
22: Detection circuit
23: Driver IC
100, 100R: Insulating substrate
110: Gate layer electrode
120: Gate insulating film
130: Source layer electrode
200, 200R: Lower layer
300: Passivation film
310, 310R: First insulating film
311, 701, 703: Protrusion
311A, 311C, 321A: Upper surface
311B, 321B: Side surface
311D, 321D: Bottom
311E, 311G, 311H: Slope
311F: Recess
312, 321, 801: End portion
322, 802: Second end portion
320, 320R: Second insulating film
330R: Third insulating film
400, 410, 420, 400R: Upper layer
500, 500R: Hole
600: Modified layer
610: Wall
700: Organic insulating film
702: Transparent conductive film
710: Flattening film
720: Transparent conductive layer (common electrode)
800: Mask
810: Aperture
A: Step structure
B: Thickness
α, β: angle
w: protrusion width

The invention claimed is:

1. A substrate comprising:
an insulating substrate;
a lower layer stacked above the insulating substrate;
a first insulating film stacked on the lower layer;
a second insulating film stacked on the first insulating film;
an upper layer stacked on the second insulating film; and
a modified layer containing a material different from a material of the second insulating film, wherein
the substrate includes a hole reaching at least one of the lower layer or the insulating substrate through at least the first insulating film and the second insulating film, the first insulating film includes, in a region with the hole, a protrusion that protrudes from an end portion of the second insulating film in contact with the first insulating film, the substrate includes a stepwise structure including the protrusion of the first insulating film and the end portion of the second insulating film, the upper layer coats the stepwise structure, an upper surface portion of the first insulating film in a region with the protrusion and an upper surface portion of the first insulating film in a region below the end portion of the second insulating film are coplanar, and the modified layer is on a side surface closer to the hole of the second insulating film.

2. The substrate according to claim 1, wherein
the second insulating film is a silicon nitride film, and
the first insulating film is a silicon oxide film, a silicon nitride film having a lower etching rate than the second insulating film, or a silicon oxynitride film.

3. The substrate according to claim 1, wherein
the second insulating film is a silicon oxynitride film, and
the first insulating film is a silicon oxide film or a silicon oxynitride film having a lower etching rate than the second insulating film.

4. The substrate according to claim 1, wherein
the end portion of the second insulating film is a first end portion,
the substrate further comprises an organic insulating film between the first insulating film and the second insulating film,
the hole reaches at least one of the lower layer or the insulating substrate through the first insulating film, the second insulating film, and the organic insulating film,
in a first direction, the organic insulating film is coated with the second insulating film, and, in the region with the hole, the first insulating film and the second insulating film define the stepwise structure,
in a second direction which is different from the first direction, an end portion of the organic insulating film is not coated with the second insulating film, and
the organic insulating film includes, in the region with the hole, a protrusion that protrudes from a second end portion of the second insulating film.

5. The substrate according to claim 1, wherein
the substrate further comprises a transparent conductive film between the first insulating film and the second insulating film, and
the transparent conductive film includes in the region with the hole a protrusion that protrudes from a second end portion of the second insulating film.

6. A method for producing a substrate, comprising:
an etching step including dry-etching on a pre-treated substrate including an insulating substrate, a lower layer stacked above the insulating substrate, a first insulating film stacked on the lower layer, and a second insulating film stacked on the first insulating film through a mask provided with an aperture to form a hole reaching at least one of the lower layer or the insulating substrate through at least the first insulating film and the second insulating film, the etching step includes:
a first etching including etching the second insulating film in a region vertically below the aperture and in a region vertically below an aperture side end portion of the mask using a first etching gas to expose the first insulating film; and a second etching including etching the first insulating film in a region vertically below the aperture using a second etching gas to expose at least one of the lower layer or the insulating substrate while keeping an upper surface portion of the first insulating film unetched in an exposed region vertically below the end portion of the mask, and forming a modified layer containing a material different from a material of the second insulating film on a side surface closer to the hole of the second insulating film.

7. The method for producing a substrate according to claim 6, wherein, in the first etching, the first insulating film in the exposed region vertically below the aperture is partly etched.

8. The method for producing a substrate according to claim 6, wherein the second insulating film is kept coated with the mask until the second etching is finished.

9. The method for producing a substrate according to claim 6, wherein, in the second etching, the second insulating film is etched while the mask is etched to expand the aperture until the modified layer and part of the second insulating film are exposed from the mask.

10. The method for producing a substrate according to claim 6, wherein
the first etching gas contains $SF_6$ and $O_2$, and
the second etching gas contains $CF_4$ and $O_2$ or Ar.

11. The method for producing a substrate according to claim 10, wherein the first etching gas contains 20 mol % or more of $O_2$ relative to a whole amount of the first etching gas.

12. The method for producing a substrate according to claim 10, wherein the second etching gas contains 10 mol % or more and 60 mol % or less of $O_2$ or Ar relative to a whole amount of the second etching gas.

13. The method for producing a substrate according to claim 6, wherein
the pre-treated substrate further includes an organic insulating film between the first insulating film and the second insulating film, and
in the first etching, the first insulating film and the organic insulating film are exposed in the region vertically below the aperture, the organic insulating film is exposed in the region vertically below a second end portion closer to the aperture of the mask, and etching of the second insulating film continues even after exposure of the organic insulating film.

14. The method for producing a substrate according to claim 6, wherein
the pre-treated substrate further includes a transparent conductive film between the first insulating film and the second insulating film, and
in the first etching, the first insulating film and the transparent conductive film are exposed in the region vertically below the aperture, the transparent conductive film is exposed in the region vertically below the second end portion closer to the aperture of the mask, and etching of the second insulating film continues even after exposure of the transparent conductive film.

* * * * *